US012581636B2

(12) United States Patent
Kuo

(10) Patent No.: US 12,581,636 B2
(45) Date of Patent: Mar. 17, 2026

(54) STRESS ABSORBING TRENCH CAPACITOR AND METHOD FOR FORMING THE SAME

(71) Applicant: TAIWAN SEMICONDUCTOR MANUFACTURING COMPANY LTD., Hsinchu (TW)

(72) Inventor: Fu-Chiang Kuo, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 950 days.

(21) Appl. No.: 17/589,548

(22) Filed: Jan. 31, 2022

(65) Prior Publication Data

US 2023/0009279 A1 Jan. 12, 2023

Related U.S. Application Data

(60) Provisional application No. 63/220,433, filed on Jul. 9, 2021.

(51) Int. Cl.
H10B 12/00 (2023.01)
H10D 1/00 (2025.01)
H10D 1/68 (2025.01)

(52) U.S. Cl.
CPC ........ H10B 12/033 (2023.02); H10B 12/0387 (2023.02); H10D 1/042 (2025.01); H10D 1/716 (2025.01)

(58) Field of Classification Search
CPC .......................... H10B 12/033; H10B 12/0387; H10B 12/038; H10B 12/037; H01L 28/91; H10D 1/716; H10D 1/042
See application file for complete search history.

(56) References Cited

U.S. PATENT DOCUMENTS

| | | | |
|---|---|---|---|
| 11,063,157 B1 * | 7/2021 | Cheng ............... | H01L 21/32139 |
| 11,164,749 B1 * | 11/2021 | Chong ............. | H01L 21/67075 |
| 2007/0269982 A1 * | 11/2007 | Rocklein ........... | C23C 16/45525 257/E21.585 |
| 2009/0047769 A1 * | 2/2009 | Bhat ...................... | H10B 12/09 257/E21.532 |
| 2016/0163711 A1 * | 6/2016 | Arndt ................. | H10B 12/0387 438/387 |
| 2019/0074349 A1 * | 3/2019 | Lin .................... | H01L 21/31053 |

(Continued)

FOREIGN PATENT DOCUMENTS

| | | | | |
|---|---|---|---|---|
| CN | 103227101 A | * | 7/2013 | ............. H01L 28/91 |

*Primary Examiner* — Calvin Y Choi
(74) *Attorney, Agent, or Firm* — WPAT LAW; Anthony King

(57) ABSTRACT

The present disclosure provides a method of manufacturing a semiconductor structure. The method includes providing a substrate; forming a trench with a predetermined aspect ratio in the substrate to form two fins, wherein the forming of the trench induces the substrate to warp toward a first direction; forming a metal-insulator-metal (MIM) stack on sidewalls of the two fins in the trench, and leaving a space surrounded by the MIM stack in the trench; determining whether the substrate warps toward a second direction reverse to the first direction after the forming of the MIM stack; and in response to the substrate warping toward the second direction, depositing an insulating layer to cover an upper surface of the MIM stack and seal the trench to thereby leave a void in the space.

20 Claims, 33 Drawing Sheets

(56)              References Cited

U.S. PATENT DOCUMENTS

2020/0066922  A1*   2/2020   Cheng ................... H01L 27/016
2020/0105683  A1*   4/2020   Yen ..................... H01L 23/3192
2020/0176552  A1*   6/2020   Chang ................. H01L 23/5329

* cited by examiner

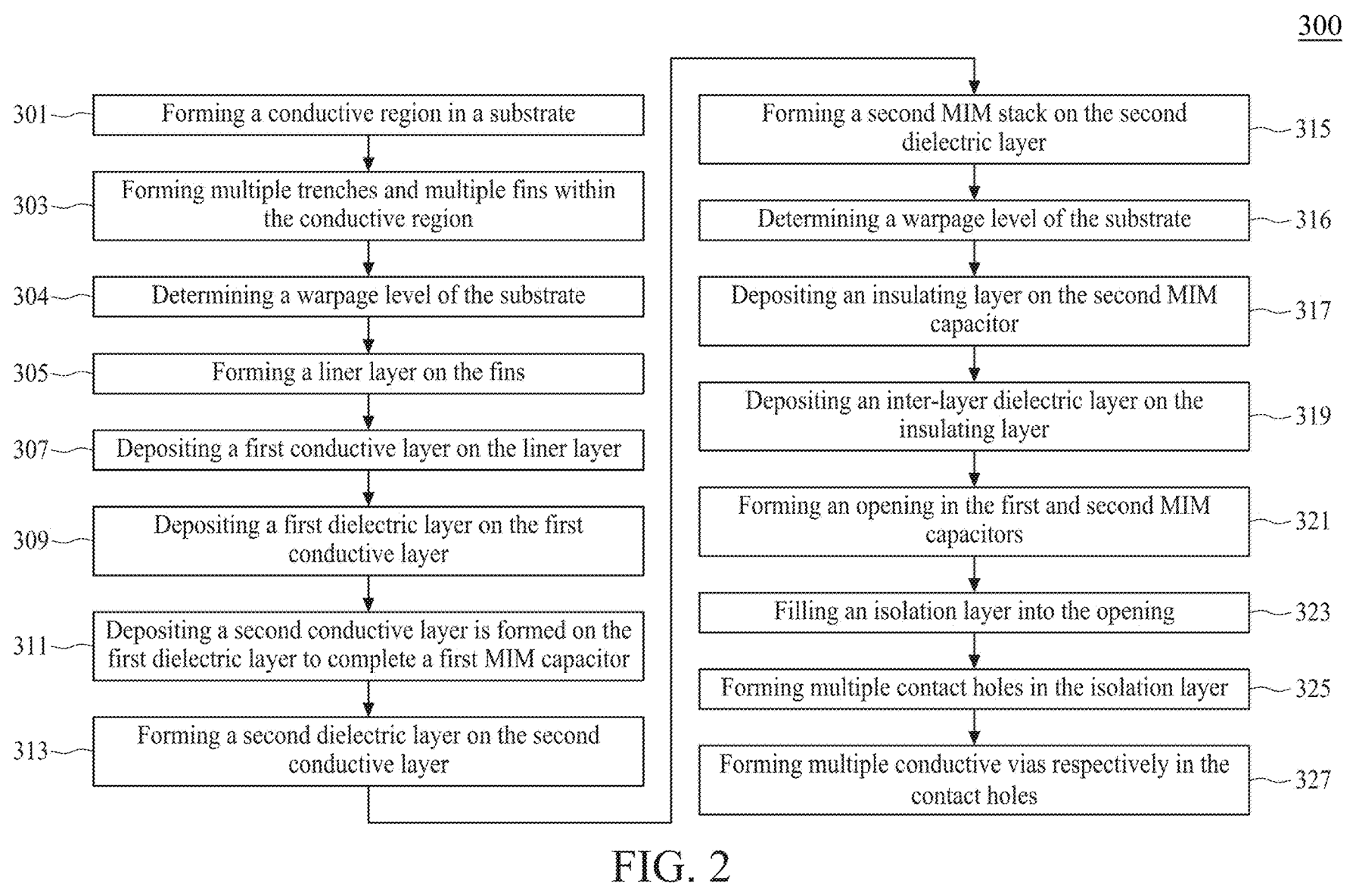

300

301 — Forming a conductive region in a substrate

303 — Forming multiple trenches and multiple fins within the conductive region

304 — Determining a warpage level of the substrate

305 — Forming a liner layer on the fins

307 — Depositing a first conductive layer on the liner layer

309 — Depositing a first dielectric layer on the first conductive layer

311 — Depositing a second conductive layer is formed on the first dielectric layer to complete a first MIM capacitor 313 — Forming a second dielectric layer on the second conductive layer 315 — Forming a second MIM stack on the second dielectric layer 316 — Determining a warpage level of the substrate 317 — Depositing an insulating layer on the second MIM capacitor 319 — Depositing an inter-layer dielectric layer on the insulating layer 321 — Forming an opening in the first and second MIM capacitors 323 — Filling an isolation layer into the opening 325 — Forming multiple contact holes in the isolation layer 327 — Forming multiple conductive vias respectively in the contact holes

FIG. 2

STRESS ABSORBING TRENCH CAPACITOR AND METHOD FOR FORMING THE SAME

PRIORITY CLAIM AND CROSS-REFERENCE

This application claims priority to U.S. Provisional Application No. 63/220,433 filed Jul. 9, 2021, the disclosures of which are hereby incorporated by reference in its entirety.

BACKGROUND

A basic capacitor is a device including a dielectric layer sandwiched by a pair of electrodes. A capacitor may be employed as a charge storage unit in a dynamic random access memory (DRAM), may be provided as a stand-alone semiconductor chip, or may be embedded in a system-on-chip (SoC) semiconductor chip. In addition, a capacitor may also be employed in a variety of circuit applications such as a charge pump or a capacitive analog component in a radio-frequency (RF) circuit.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

FIG. 2 is a flow diagram showing a method of fabricating a semiconductor device, in accordance with some embodiments of the present disclosure.

DETAILED DESCRIPTION

Figure 1A:
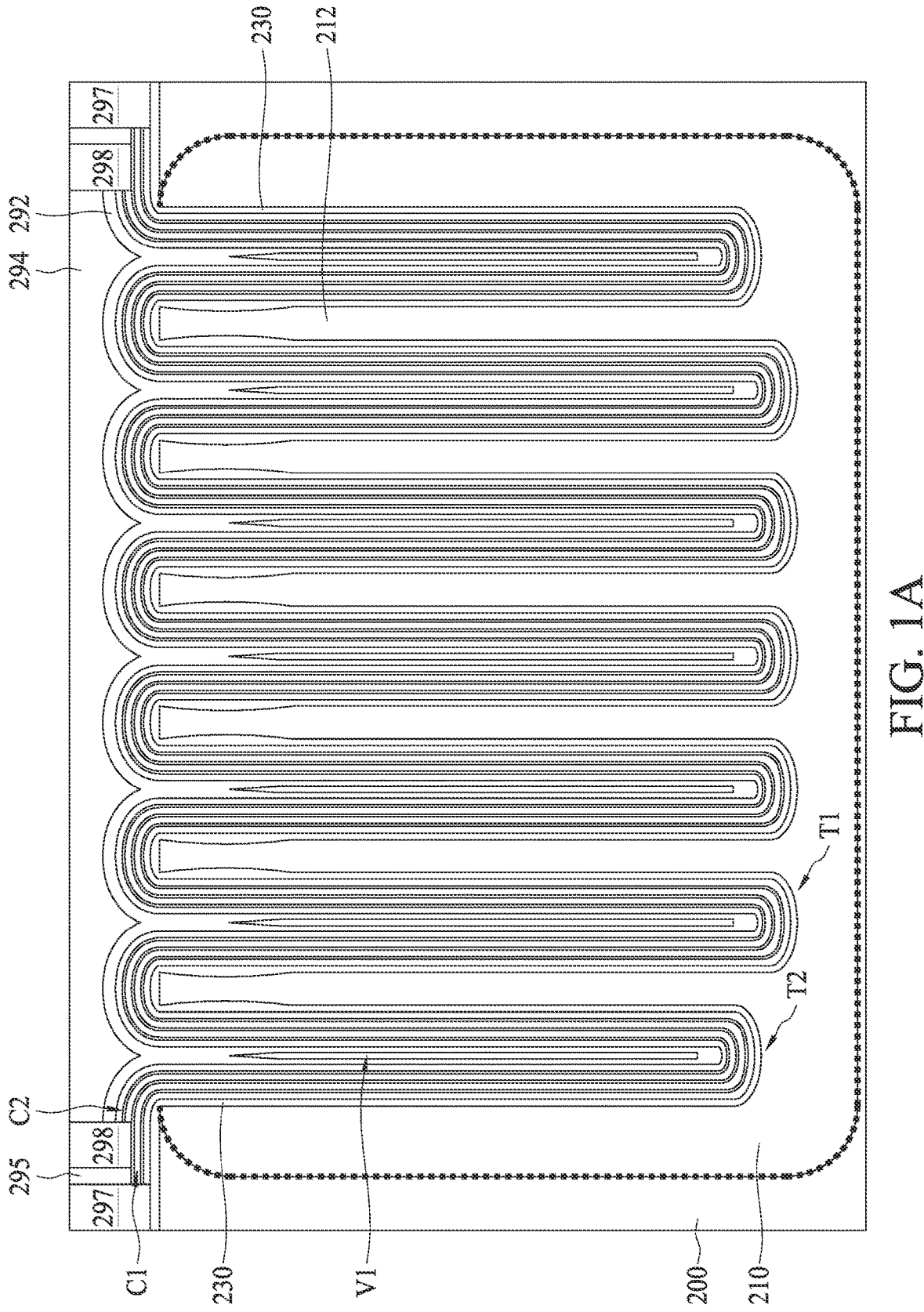
FIG. 1A is a schematic cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A basic trench capacitor is a small three-dimensional device formed by etching a trench into a semiconductor substrate. A deep trench capacitor (DTC) is used to provide capacitance to various integrated circuits (ICs). Deep trench capacitors can be used in a variety of semiconductor chips for high areal capacitance and low device leakage. Typically, a deep trench capacitor provides a capacitance in the range from 4 femtoFarad (fF) to 120 fF. An advantage of using the deep trench capacitor over package structures is that it can be freely placed as close as possible to the desired process- ing units. Additionally, the deep trench capacitor can also provide higher capacitance per unit area. Deep trench capacitors are commonly embedded in integrated passive devices (IPDs) and used in place of ceramic capacitors to reduce the size of semiconductor device, reduce the cost of semiconductor devices, increase the functionality of semi- conductor devices, or any combination of the foregoing.

FIG. 1A is a schematic cross-sectional view of a semi- conductor device 20. The semiconductor device 20 includes a substrate 200 in which a doped region 210 is formed. Multiple trenches T1, T2 and multiple fins 212 are formed within the doped region 210. Each of the trenches T1 separates adjacent fins 212 and the trench T2 separates a fin 212 adjacent to the unpatterned substrate 200. Each of the fins 212 may be conductive due to its containing of con- ductive ions or dopants. A liner layer 230 is conformally disposed on surfaces of the fins 122. A first metal-insulator- metal (MIM) capacitor C1 is disposed in the trenches T1, T2 and conformally over the liner layer 230. A second MIM capacitor C2 is disposed in the trenches T1, T2 and confor- mally over the first MIM capacitor C1. The second MIM capacitor C2 is disposed in parallel to and vertically over the first MIM capacitor C1. The first MIM capacitor C1 and the second MIM capacitor C2 extend over the doped region 210 and the substrate 200. An insulating layer 292 is disposed in the trenches T1, T2 and over the second MIM capacitor C2. The insulating layer 292 seals the trenches T1 and T2. The portion of the insulating layer 292 in the respective trenches T1 and T2 is substantially hollow. Multiple voids V1 are formed inside the insulating layer 292. An interlayer dielec- tric (ILD) layer 294 is disposed over the insulating layer 292. A conductive via 297 is disposed adjacent to and electrically coupled to the first MIM capacitor C1. A con- ductive via 298 is disposed adjacent to and electrically coupled to the second MIM capacitor C2. The conductive via 297 and the conductive via 298 are separated by an isolation layer 295.

Figure 1B:
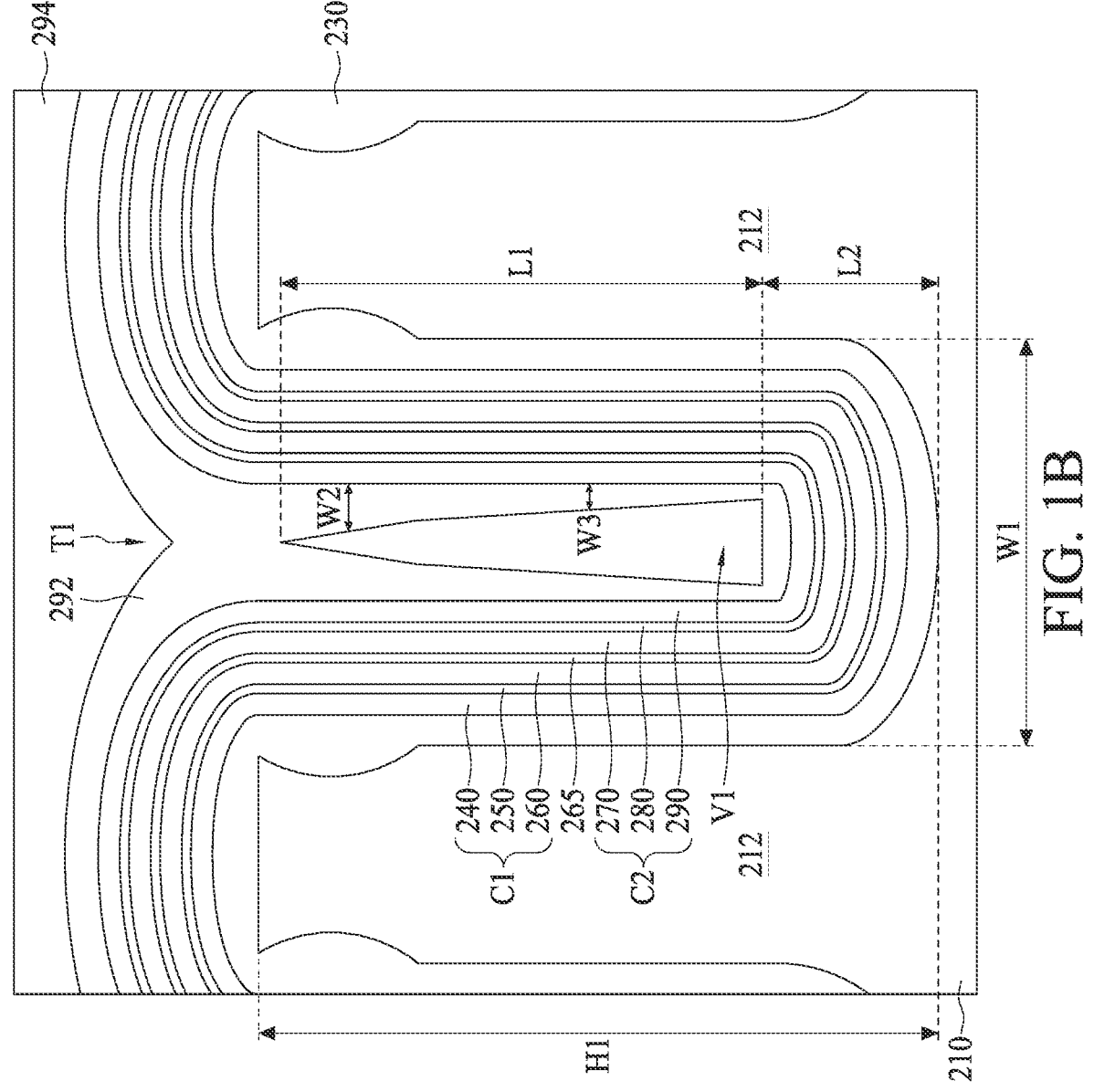
FIG. 1B is an enlarged view showing a void in the semiconductor device in FIG. 1A, in accordance with some embodiments of the present disclosure.

FIG. 1B is an enlarged view showing one of the voids V1 in the semiconductor device 20 in FIG. 1A. The first MIM capacitor C1 includes a first conductive layer 240, a first dielectric layer 250 conformally over the first conductive layer 240, and a second conductive layer 260 conformally over the first dielectric layer 250. A second dielectric layer 265 is conformally disposed over the second conductive layer 260. The second MIM capacitor C2 is conformally disposed over the second dielectric layer 265. The second MIM capacitor C2 includes a third conductive layer 270, a third dielectric layer 280 conformally over the third con- ductive layer 270, and a fourth conductive layer 290 con- form ally over the third dielectric layer 280. The first MIM capacitor C1 and the second MIM capacitor C2 are deep trench capacitors. A thickness of the first conductive layer 240, the second conductive layer 260, the third conductive layer 270 and the fourth conductive layer 290 may be between about 200 angstroms (Å) and about 300 Å. A thickness of the first dielectric layer 250, the second dielec- tric layer 265 and the third dielectric layer 280 may be less than 100 Å. A depth H1 of the trench T1, measured from a top surface of a bottom portion of the substrate 210 to a top surface of the fins 212, may be about 20 micrometers (μm) to about 40 μm. A width W1 of the trench T1, measured between two facing sidewalk of adjacent fins 212, may be about 0.3 μm to about 0.7 μm, An aspect ratio of the depth H1 to the width W1 may range from about 20:1 to about 140:1. A thickness W2 of the insulating layer 292 covering an upper portion of the fourth conductive layer 290 in the top half of the trench T1 may be about 15 nanometers (nm) to about 22 nm. A thickness W3 of the insulating layer 292 covering a lower portion of the fourth conductive layer 290 in the bottom half of the trench T1 may be about 4 nm to about 10 nm. A thickness ratio between the thickness W2 to the thickness W3 is about 1.5 to about 5.5. A height L1 of the void V1 may be equal to or more than 0.95 times the depth H1 of the trench T1 or a height of each one of the fins 212. The void V1 may have different diameters at different heights. The void V1 may taper toward the entrance E1 (see also FIG. 4C) of the trench T1. A distance L2 between a bottommost point of the void V1 and a bottommost point of the trench T1 is about 80 nm to about 120 nm.

FIG. 2 is a flow diagram showing a method 300 of fabricating the semiconductor device 20 in FIG. 1A, FIGS. 3 to 20 are schematic cross-sectional views and top views illustrating sequential operations of the method 300 shown in FIG. 2.

Figure 3:
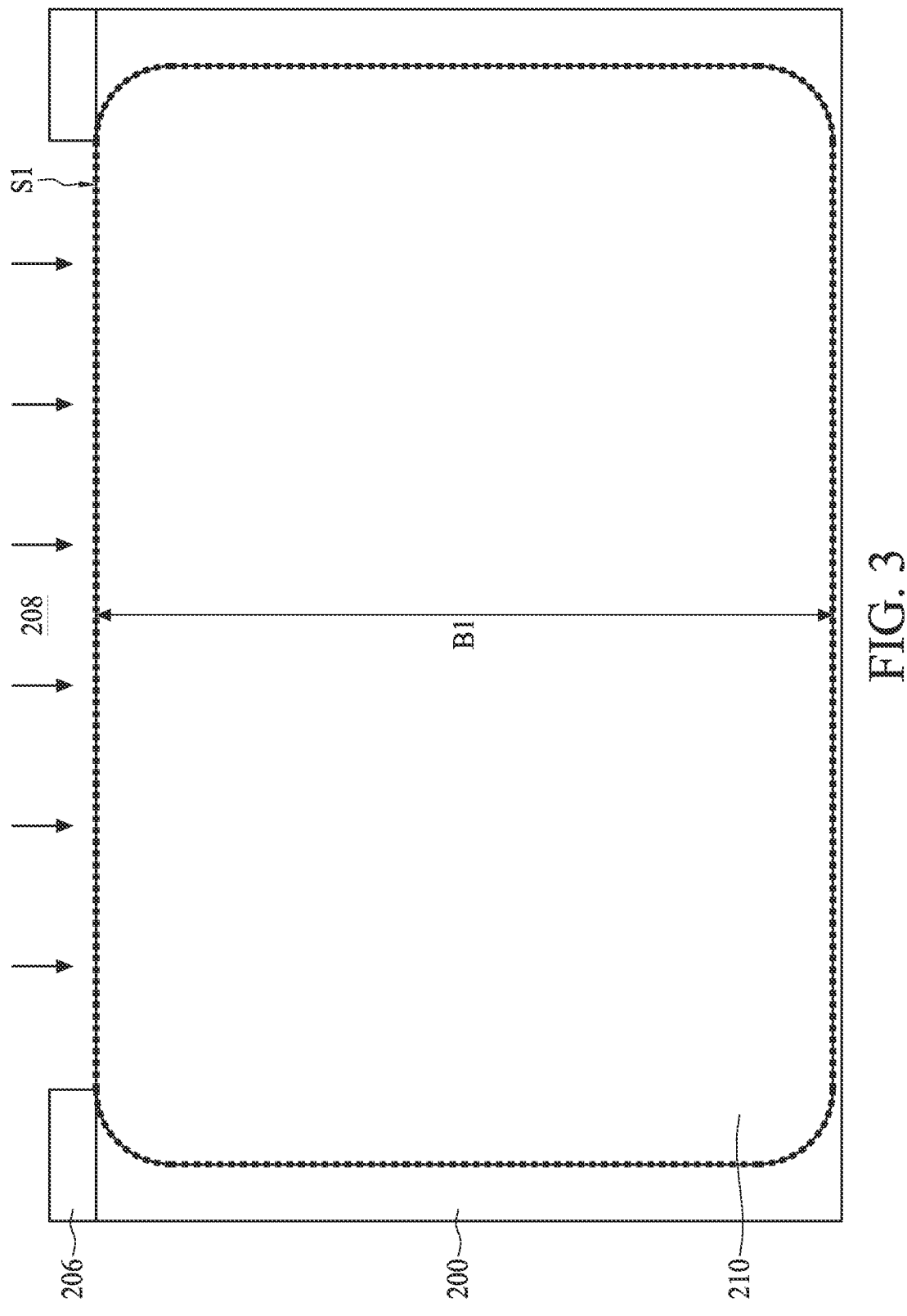
FIGS. 3, 4A to 4G, 7 to 13, 15A to 15D and 16 to 21 are schematic cross-sectional views illustrating sequential operations of the method shown in FIG. 2, in accordance with some embodiments of the present disclosure.

Referring to operation 301 of FIG. 2, a doped region 210 is formed in a substrate 200, as shown in FIG. 3. The substrate 200 having a top surface S1 is provided. The substrate 200 may be a silicon wafer. In some embodiments, the substrate 200 is a silicon-on-insulator (SOI) substrate, a polysilicon substrate, or an amorphous silicon substrate. The substrate 200 may include a suitable elementary semicon- ductor, such as germanium (Ge) or diamond. In some embodiments, the substrate 200 includes a compound semi- conductor, such as silicon germanium (SiGe), silicon car- bide (SiC), gallium arsenide (GaAs), gallium nitride (GaN), indium phosphide (InP) or the like. An ion implantation operation may be performed on the substrate 200 to form the doped region 210, An implant mask 206 including at least one opening may be formed on the substrate 200. A beam of doping ions 208 may be implanted toward the masked substrate 200. The doping ions 208 can be P-type dopants such as boron (B), gallium (Ga) and indium (In) ions, or N-type dopants such as phosphorus (P) and arsenic (As) ions. The implant mask 206 blocks the doping ions 208 from entering the masked regions of the substrate 200, while the doping ions 208 pass through the opening of the implant mask 206 into the substrate 200. After entering from the top surface S1, the doping ions 208 in the substrate 200 may diffuse to a predetermined depth B1 of the substrate 200 to form the doped region 210. After the formation of the doped region 210, the implant mask 206 is removed.

The doped region 210 may be a P-type conductive region or an N-type conductive region. In some embodiments, the doped region 210 includes a p-n junction. For example, dopants of a first conductivity type may be doped into the substrate 200 at a first depth range. Subsequently, dopants of a second conductivity type may be doped into the substrate 200 at a second depth range adjacent to the first depth range to form the p-n junction at an interface between the first depth range and the second depth range. The second depth range may be less than the first depth range. The second conductivity type may be opposite to the first conductivity type. For example, the first conductivity type can be p-type and the second conductivity type can be n-type, or vice versa.

Figure 4A:
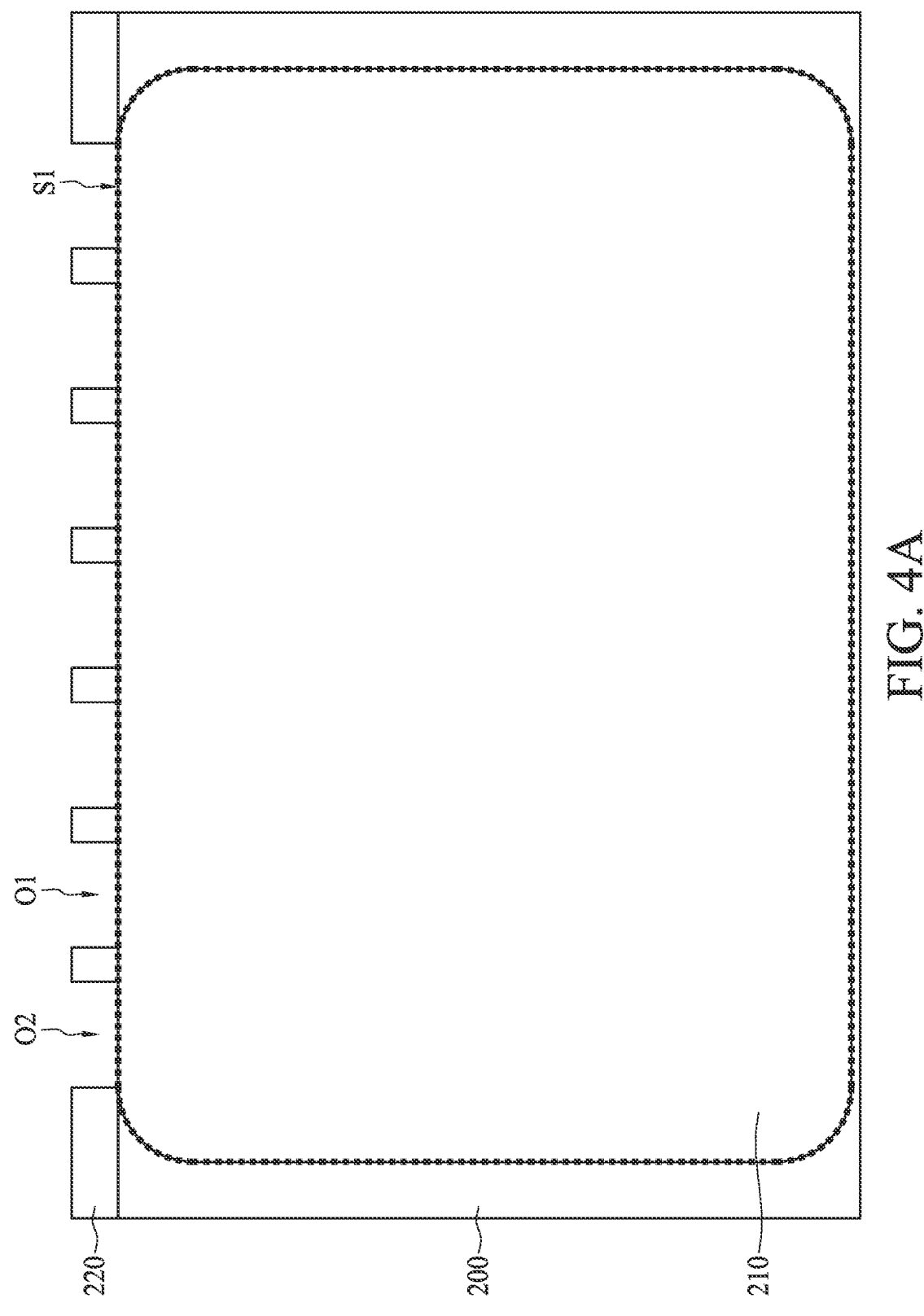
Figure 4B:
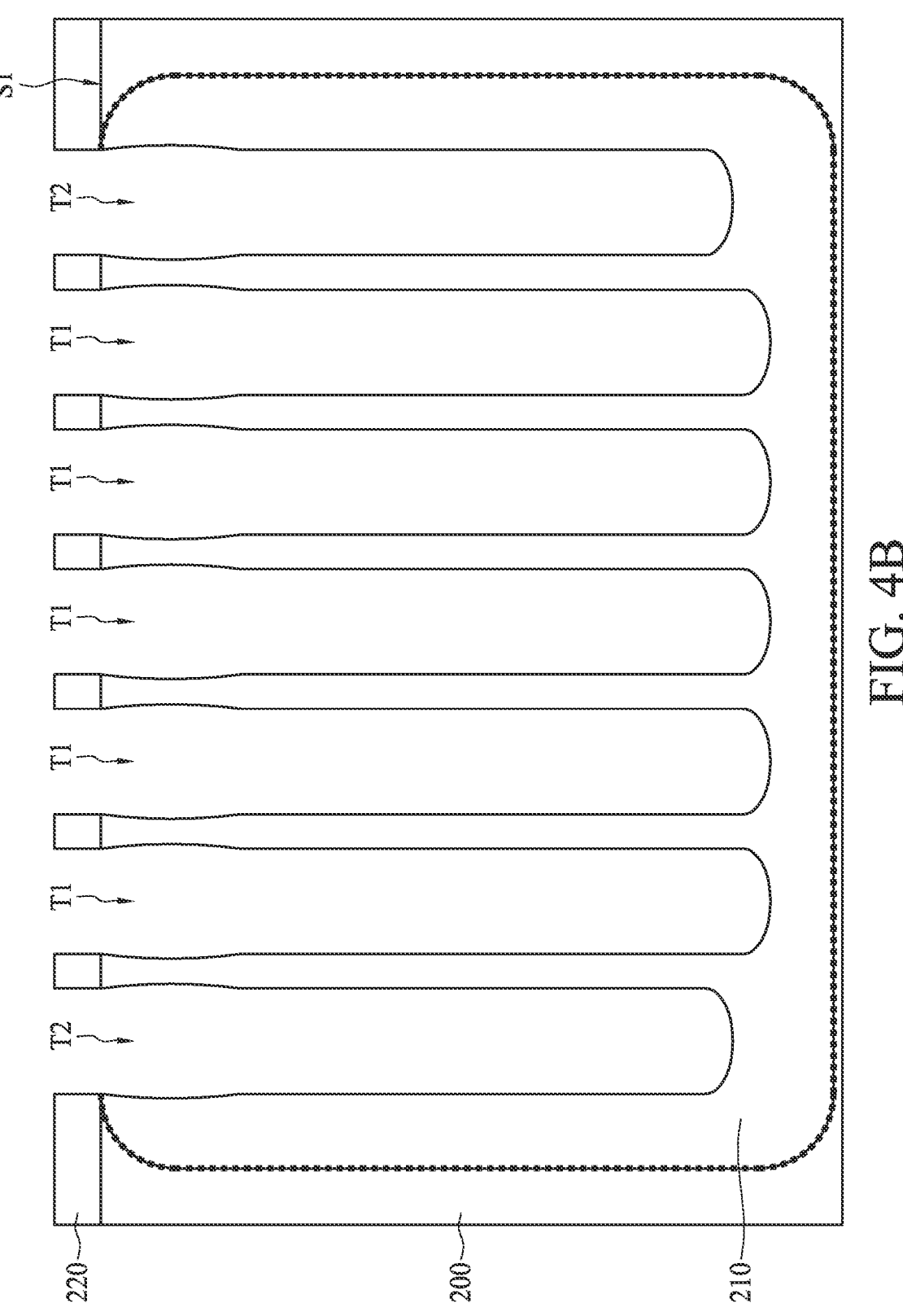
Figure 4C:
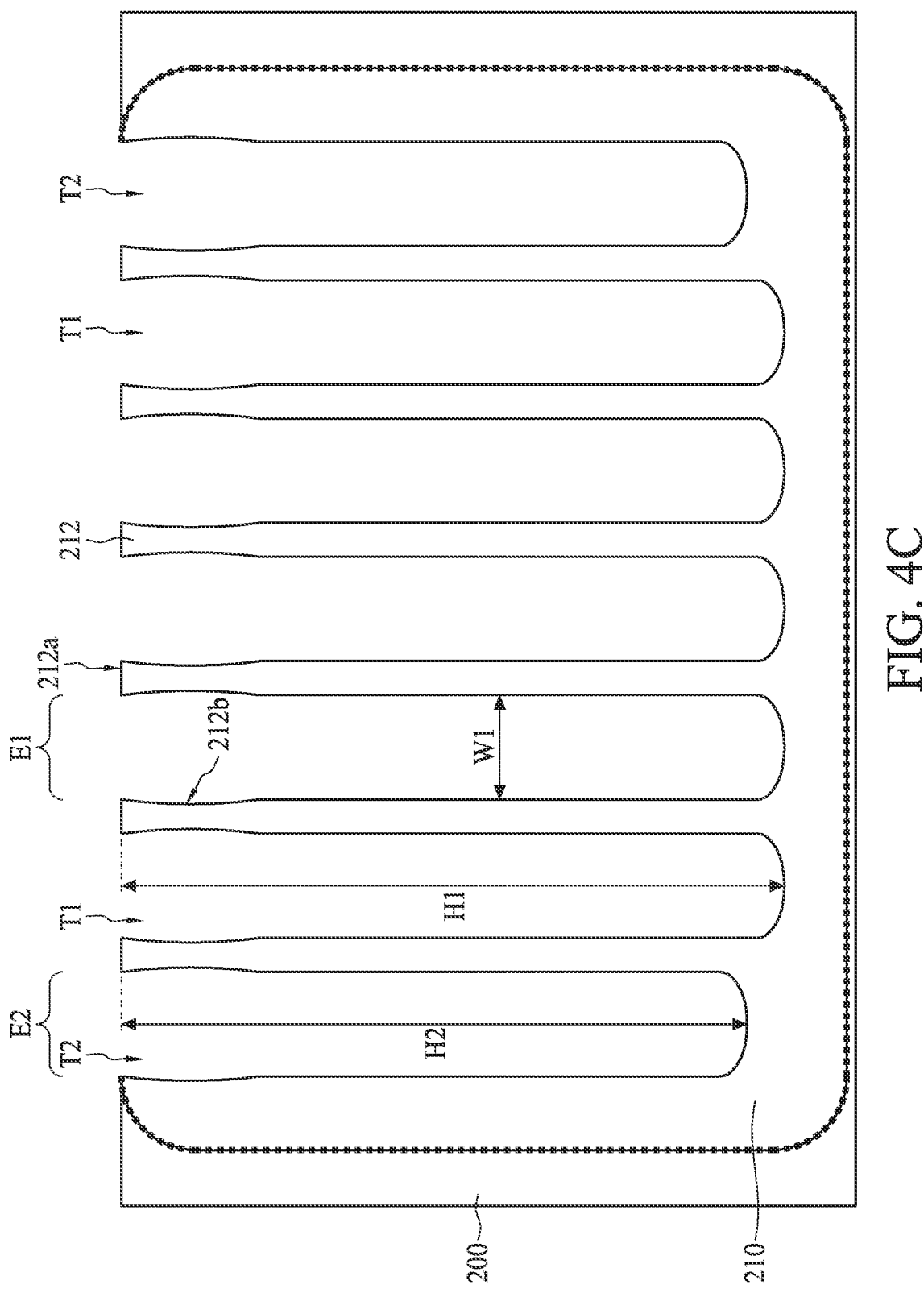
Figure 4D:
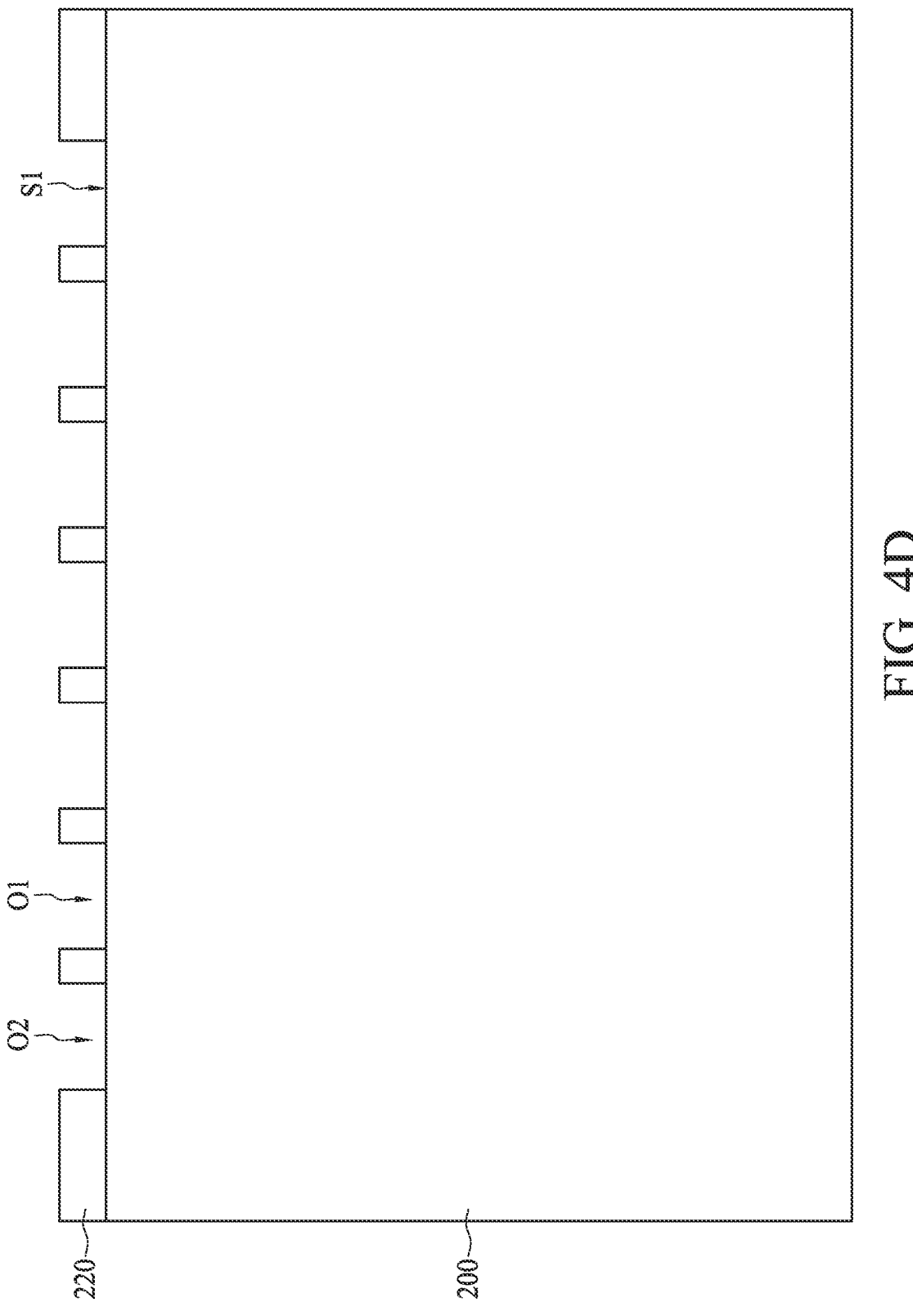

Referring to operation 303 of FIG. 2, multiple trenches T1, T2 are etched in the doped region 210, as shown in FIGS. 4A to 4C. Multiple fins 212 are formed accordingly. The doped region 210 may be patterned using one or more lithographic and etch operations. For example, a double-patterning or multi-patterning technique known in the art can be used to form the trenches T1, T2 to leave the fins 212 over the substrate 200.

Referring to FIG. 4A, a patterned mask 220 is formed on the substrate 200. The patterned mask 220 may be a patterned photoresist or a nitride hard mask. The patterned mask 220 includes parallel strips separated by multiple openings O1 and O2 that expose the underlying doped region 210.

Referring to FIG. 4B, in some embodiments, a dry etch operation is performed on the substrate 200 using the patterned mask 220 as an etching mask. The doped region 210 is etched through the openings O1 and O2 of the patterned mask 220 until multiple trenches T1 and T2 are formed.

Referring to FIG. 4C, after the patterned mask 220 is removed, multiple fins 212 are exposed. Each of the fins 212 may contain dopants. The fins 212 may be arranged in parallel strips and protruded from a lower portion of the doped region 210. The fins 212 may have respective top surfaces 212a and sidewall surfaces 212b arranged between neighboring trenches T1 and T2 or neighboring trenches T1. The top surface 212a of each fin 212 may be coplanar with the top surface S1 of the substrate 200. The sidewall surfaces 212b may be even or uneven surfaces. The trenches T1 and T2 may respectively extend downwardly from the top surface S1 of the substrate 200 into bottom portions of the doped region 210. The difference between the trench T1 and the trench T2 lies in their respective positions and depths. The trench T2 is referred to as a trench formed in a peripheral region of the doped region 210, while the trench T1 is referred to as a trench formed at a central region of the doped region 210. The trench T1 has a depth H1 as measured from the top surface S1 of the substrate 200, and the trench T2 has a depth H2 as measured from the top surface S1 of the substrate 200. The depth H1 of the trench T1 is approximately equal to a height of the respective fin 212. The trench T1 may have an entrance E1 coplanar with the top surface S1 of the substrate 200 and the trench T2 may have an entrance E2 coplanar with the top surface S1 of the substrate 200.

Still referring to FIG. 4C, since the trench T2 is proximal to a larger area of patterned mask 220 than the trench T1, the trench T2 may encounter less etchants for enlarging the trench. The depth H1 may be greater than the depth H2. The trenches T1 and T2 may each have a width W1. In some embodiments, the depths H1, H2 are about 20 μm to about 40 μm. In some embodiments, the width W1 of an individual trench T1 or T2 is about 0.3 μm to about 0.7 μm. The trenches T1 and T2 may each have a high depth-to-width aspect ratio, that is, a ratio of the depth H1 to the width W1 or a ratio of the depth H2 to the width W1 is relatively high. In some embodiments, the aspect ratio of the trench T1 or T2 ranges from about 20:1 to about 140:1 such that the trench T1 or T2 may be referred to as deep trenches (DT). The trenches T1 and T2 may be configured for formation of deep trench capacitors. The high aspect ratios are used to increase the capacitance density of the deep trench capacitors.

Figure 4E:
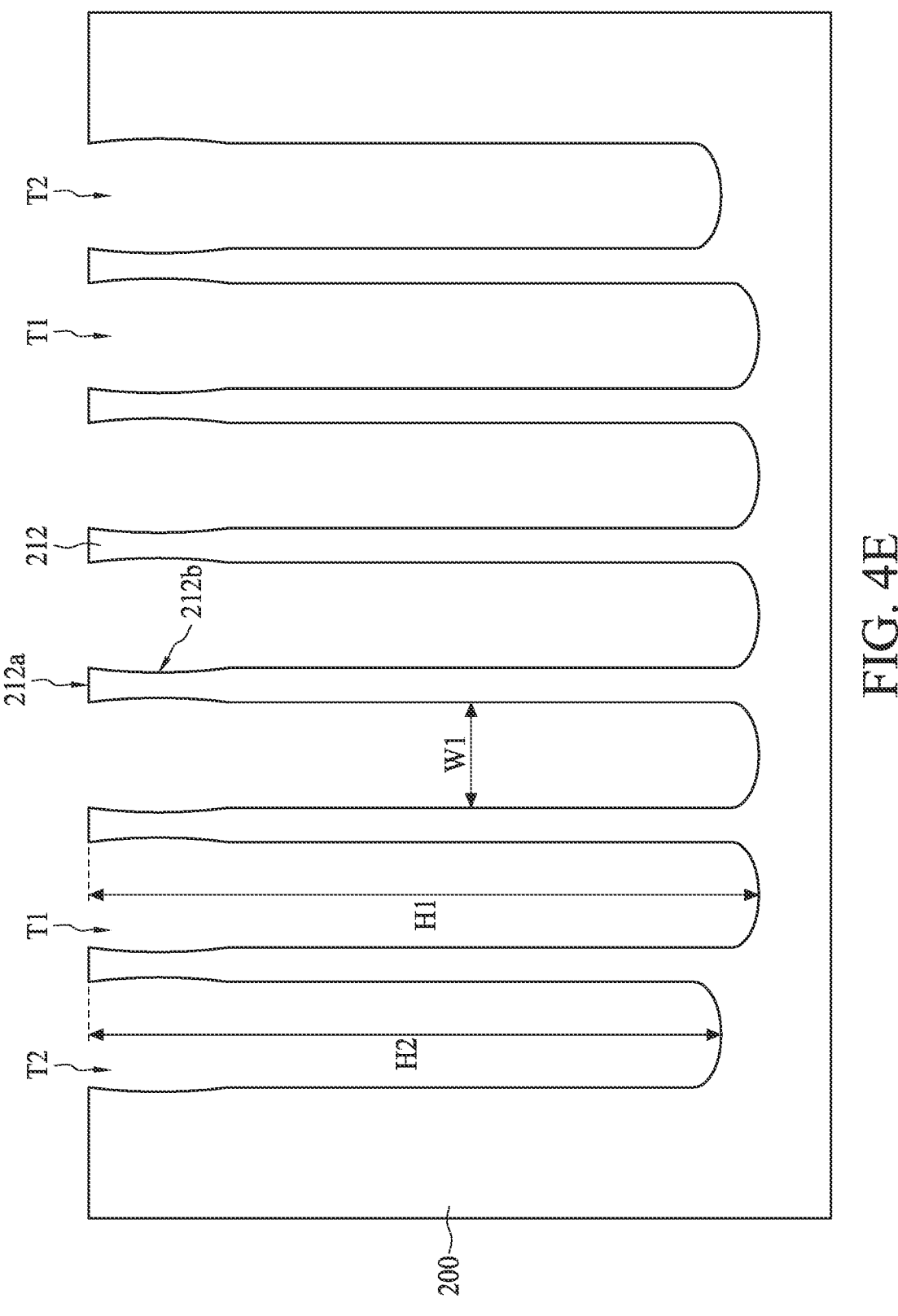
Figure 4F:
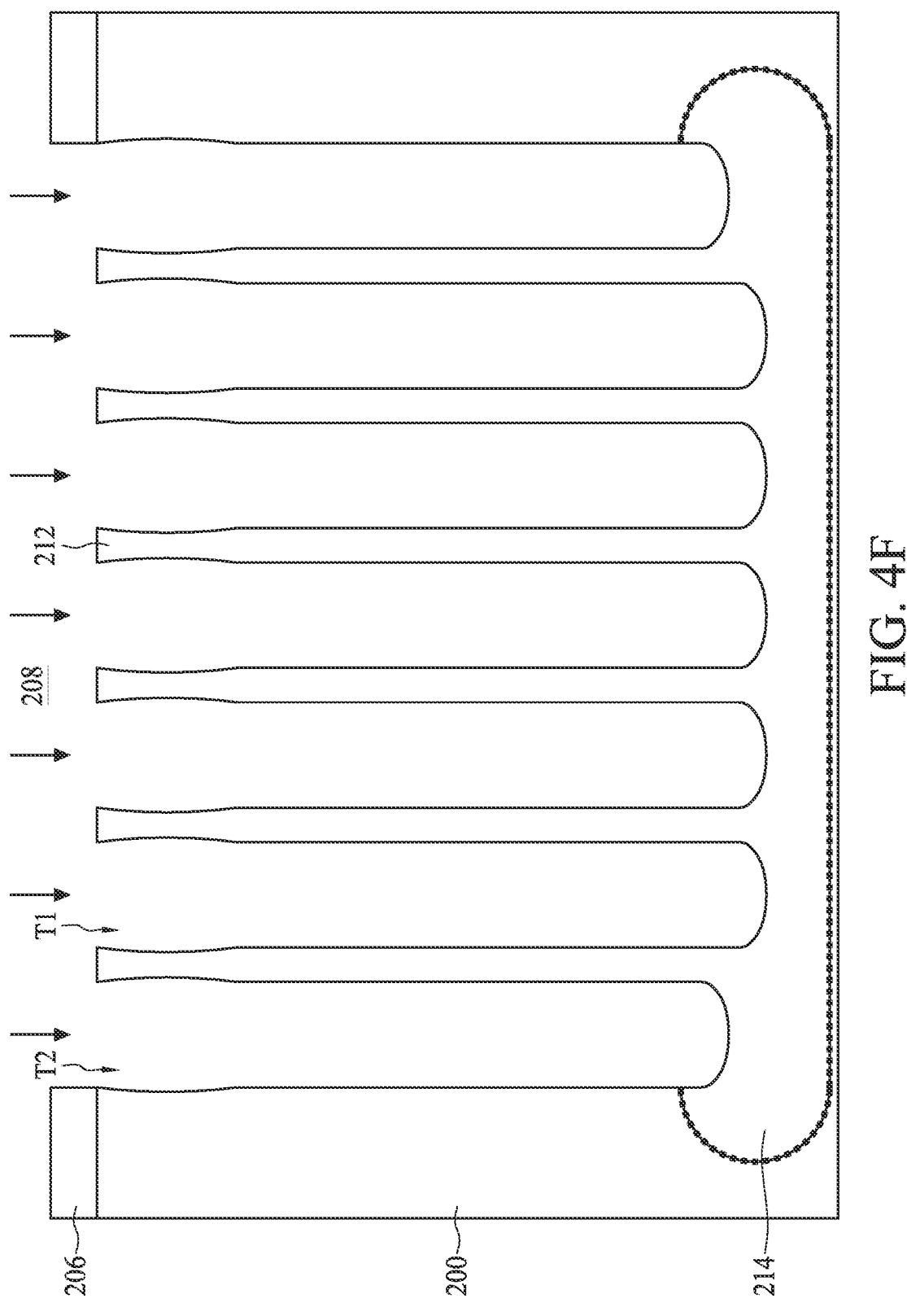
Figure 4G:
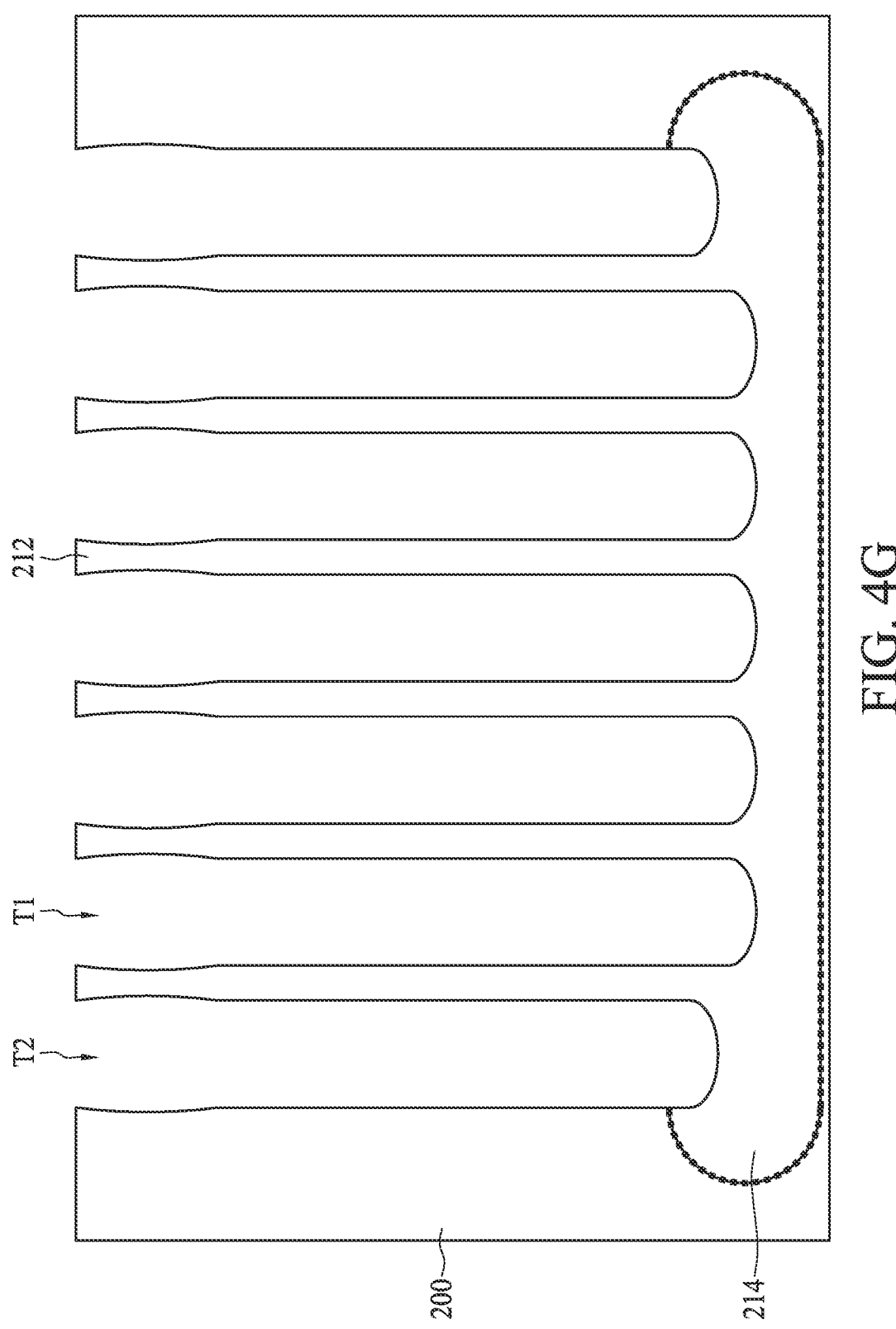

In some other embodiments, a fin containing dopants may be formed using different methods. For example, instead of the process illustrated in FIGS. 4A to 4C, referring to FIG. 4D, the patterned mask 220 including the openings O1 and O2 is formed on the substrate 200. Referring to FIG. 4E, a dry etch operation is performed on the substrate 200 using the patterned mask 220 as an etching mask. The substrate 200 is etched through the openings O1 and O2 of the patterned mask 220 to form multiple trenches T1, T2 and multiple fins 212. Referring to FIG. 4F, after the formation of the trenches T1, T2, a doped region 214 may be formed in lower portions of the substrate 200 and the fins 212 below entrances E1, E2 of the trenches T1, T2. The method of forming the doped region 214 may be similar to operation 301, while the implant mask 206 only covers the unpatterned substrate 200. The doping ions 208 may be implanted to each of the fins 212. In some embodiment, the doping ions 208 diffuse in each of the fins 212 and a portion of the substrate 200 to form the doped region 214. Referring to FIG. 4G, after the formation of the doped region 214, the implant mask 206 is removed.

Figure 5:
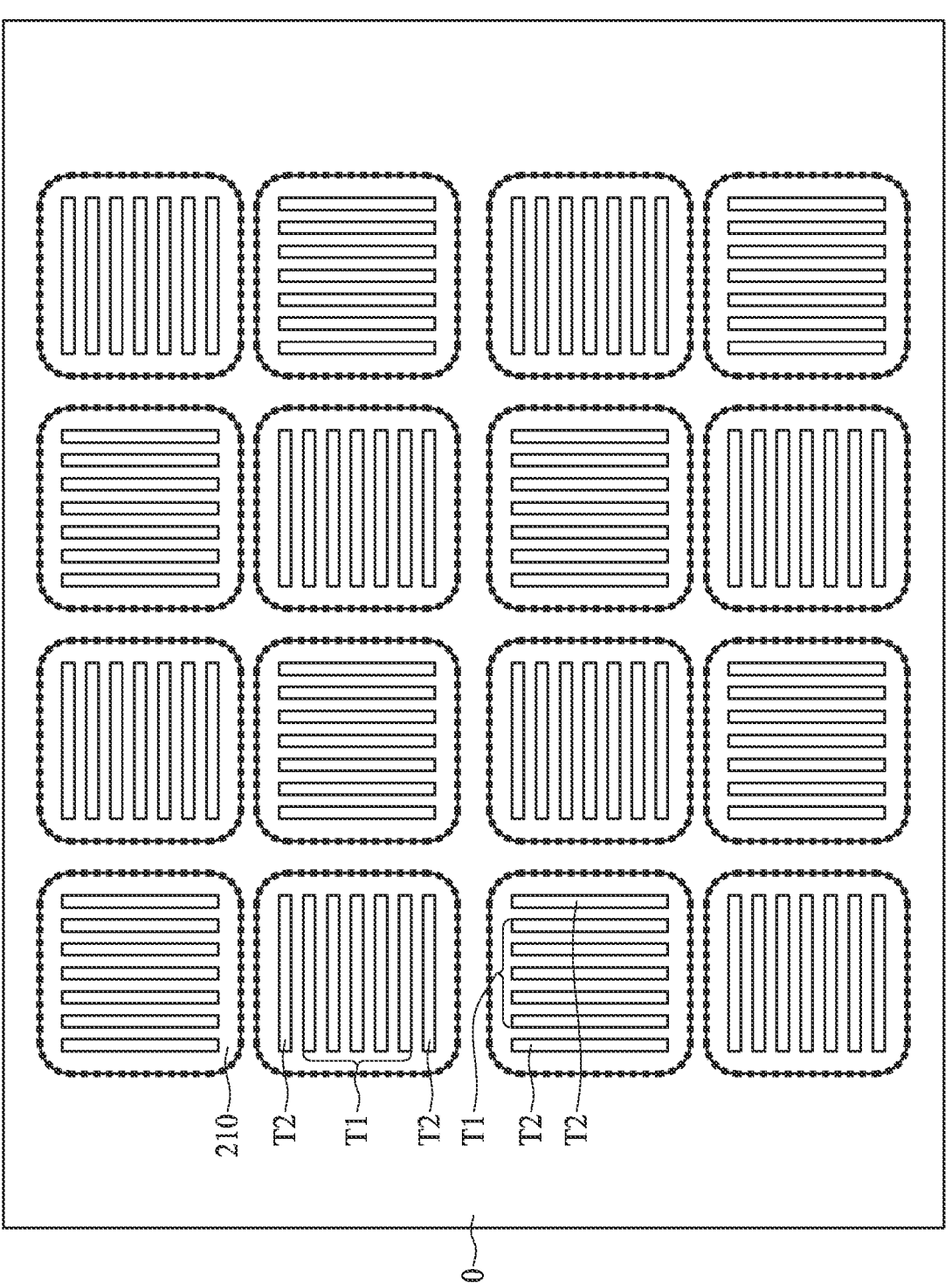
FIG. 5 is a schematic top view of FIG. 4C or 4G, in accordance with some embodiments of the present disclosure.

FIG. 5 is a schematic top view of FIG. 4C or 4G. In some embodiments, multiple doped regions 210 are formed in an array in the substrate 200. Adjacent doped regions 210 may not contact or overlap each other. Each doped region 210 includes multiple trenches T1 and T2. The trenches T1, T2 are arranged in an array of rows and columns within the doped regions 210. In some embodiments, the directions in which the trenches T1, T2 extend in adjacent doped regions 210 are orthogonal to each other from a top-view perspective. The number of trenches T1, T2 in each doped region 210 is seven, as shown in FIG. 6, but may be less than or more than seven in other embodiments.

Figure 6:
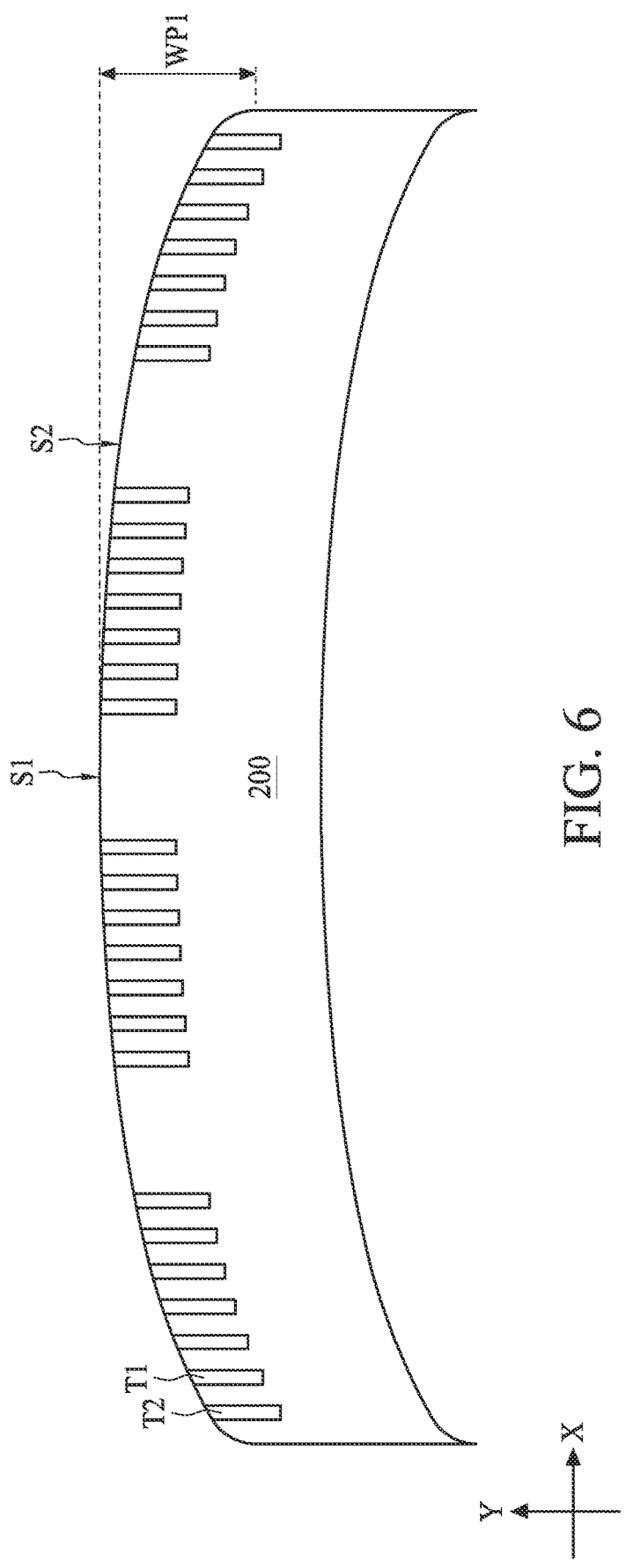
FIG. 6 is a schematic side view of a substrate including multiple trenches, in accordance with some embodiments of the present disclosure.

Referring to operation 304 of FIG. 2, a warpage level WP1 of the substrate 200 is determined or measured, as shown in FIG. 6, which is a schematic side view of the substrate 200 including the trenches T1 and T2. When multiple arrays of the trenches T1, T2 are formed in the substrate 200 (which is, for example, a wafer), an upper portion of the substrate 200 including the top surface S1 may become less dense in terms of the material of the substrate 200. The disparate trench distributions between the front side and the back side of the substrate 200 causes a compressive stress to the substrate 200. As a result, the substrate 200 may bend in a convex manner or warp toward the negative Y-axis direction (herein referred to as a convex warpage). In some embodiments, the warpage level WP1 of the substrate 200 is determined or measured as a difference between two degrees of warping when the substrate 200 is just provided and after the trenches T1, T2 are formed in the substrate 200. In some embodiments, the warpage level WP1 is defined as a convex warpage level WP1, which refers to a maximum degree to which a bending top surface S2 of the warped substrate 200 deviates from a flat top surface S1 of a freshly provided substrate 200. When the warpage level WP1 is close to zero (0) or substantially zero, the substrate 200 remains substantially flat. When the warpage level WP1 is less than zero, the substrate 200 is warped. In some embodiments, as the density of trenches T1 and T2 increases, the warpage level WP1 of the convex warpage of the substrate 200 also increases. The warpage level WP1 of the substrate 200 after the formation of the trenches T1, T2 may be up to about 200 μm. Wafer warpage impacts various wafer manufacturing processes and assembly steps of the wafer. For example, during a wafer chemical mechanical polishing (CMP) operation or a grinding operation, a warped wafer is more likely to break. Also, when a wafer is warped or not flat, photo-alignment operations or depth measurements for alignments and placements of contact landing pads and their associated contacts are affected. The wafer warpage may reduce the chip yield, due to the above discussed errors and problems encountered during the manufacturing processes.

Figure 7:
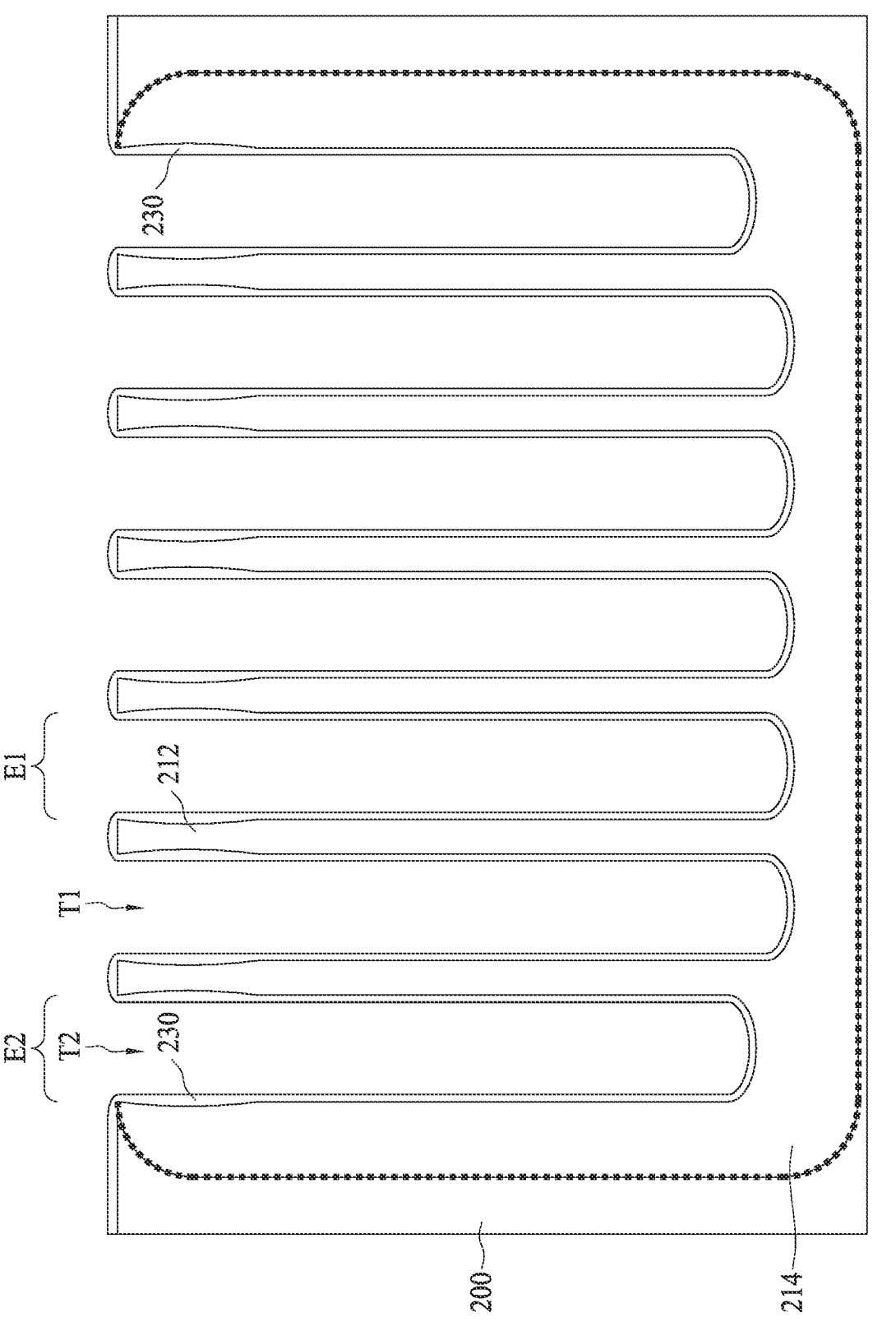

Referring to operation 305 of FIG. 2, a liner layer 230 is formed on the fins 212, as shown in FIG. 7. The formation of the liner layer 230 may use a thermal oxidation operation. For example, oxygen gas ($O_2$) may be reacted with the fins 212 under a high temperature in a furnace. The silicon material of the fins 212 may be oxidized to form silicon oxide on the top surfaces 212a and the sidewall surfaces 212b of the fins 212.

Figure 8:
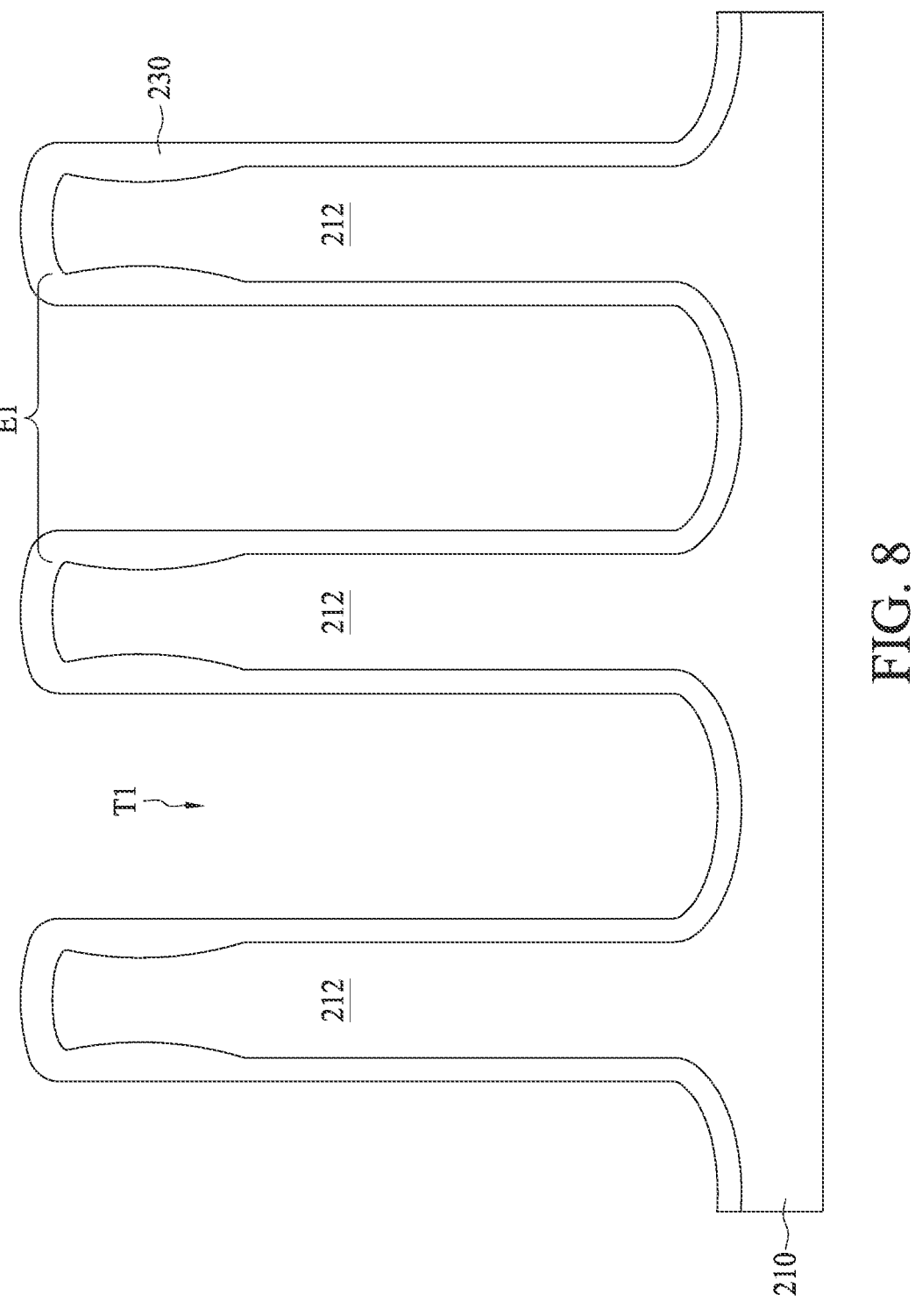

FIG. 8 is an enlarged view showing the trenches T1 and the fins 212 in FIG. 6. In some embodiments, the liner layer 230 is conformally formed on surfaces of the fins 122. The liner layer 230 may be grown to different widths at different heights so as to create an even and smooth surface over the fins 212 for subsequent operations.

Figure 9:
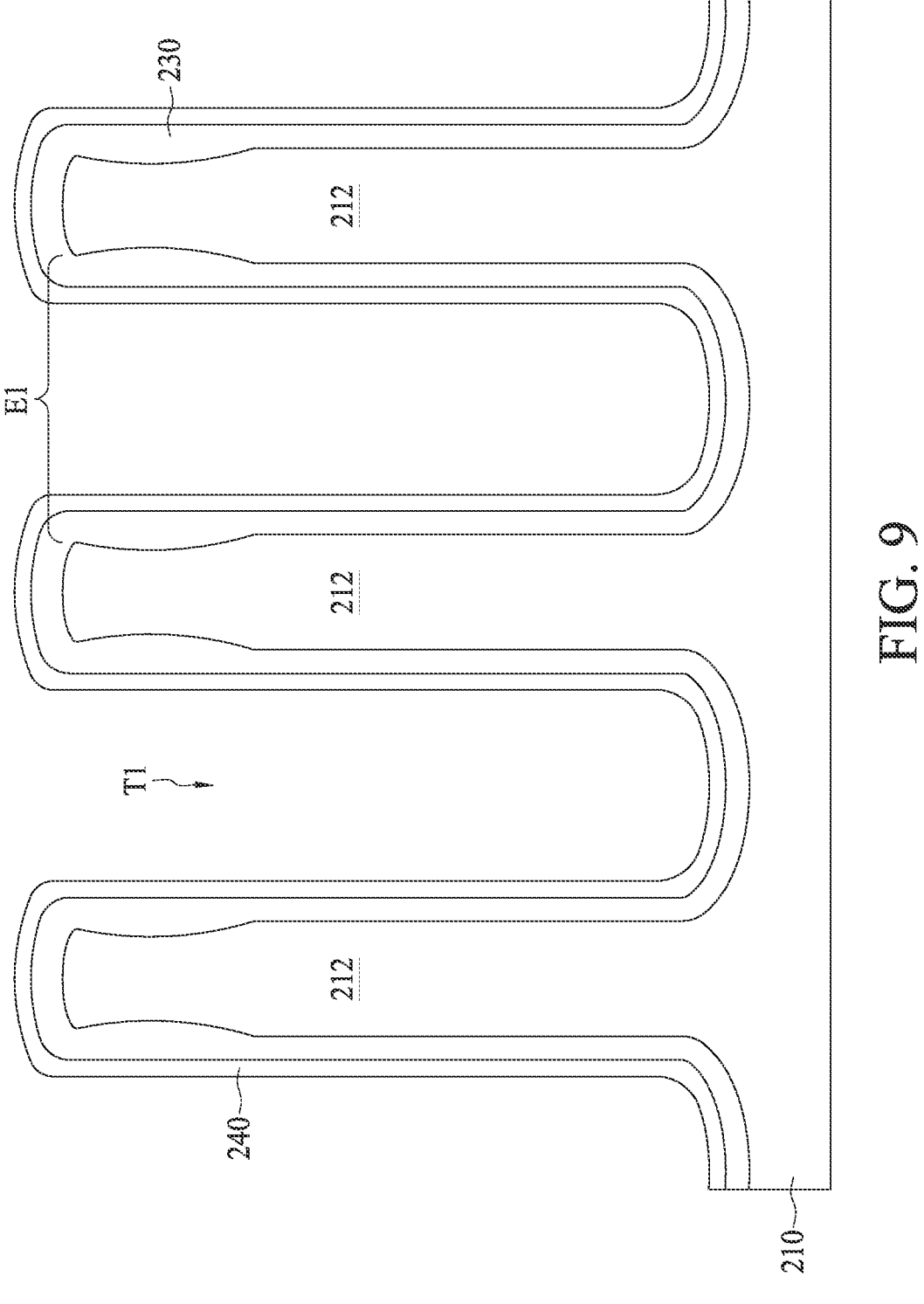

Referring to operation 307 of FIG. 2, a first conductive layer 240 is deposited on the liner layer 230, as shown in FIG. 9. In some embodiments, the first conductive layer 240 is conformally formed in the trenches T1, T2 and over the liner layer 230 using a physical vapor deposition (PVD) operation or an atomic layer deposition (ALD) operation. The first conductive layer 240 may include polysilicon or metal, such as tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au) or a combination thereof. In some embodiments, the first conductive layer 240 includes titanium nitride (TiN), tantalum nitride (TaN), aluminum copper (AlCu) or other titanium or tantalum based compounds having an appropriate conductive work function. In some embodiments, a thickness of the first conductive layer 240 is between about 100 angstroms (Å) and about 300 Å.

Figure 10:
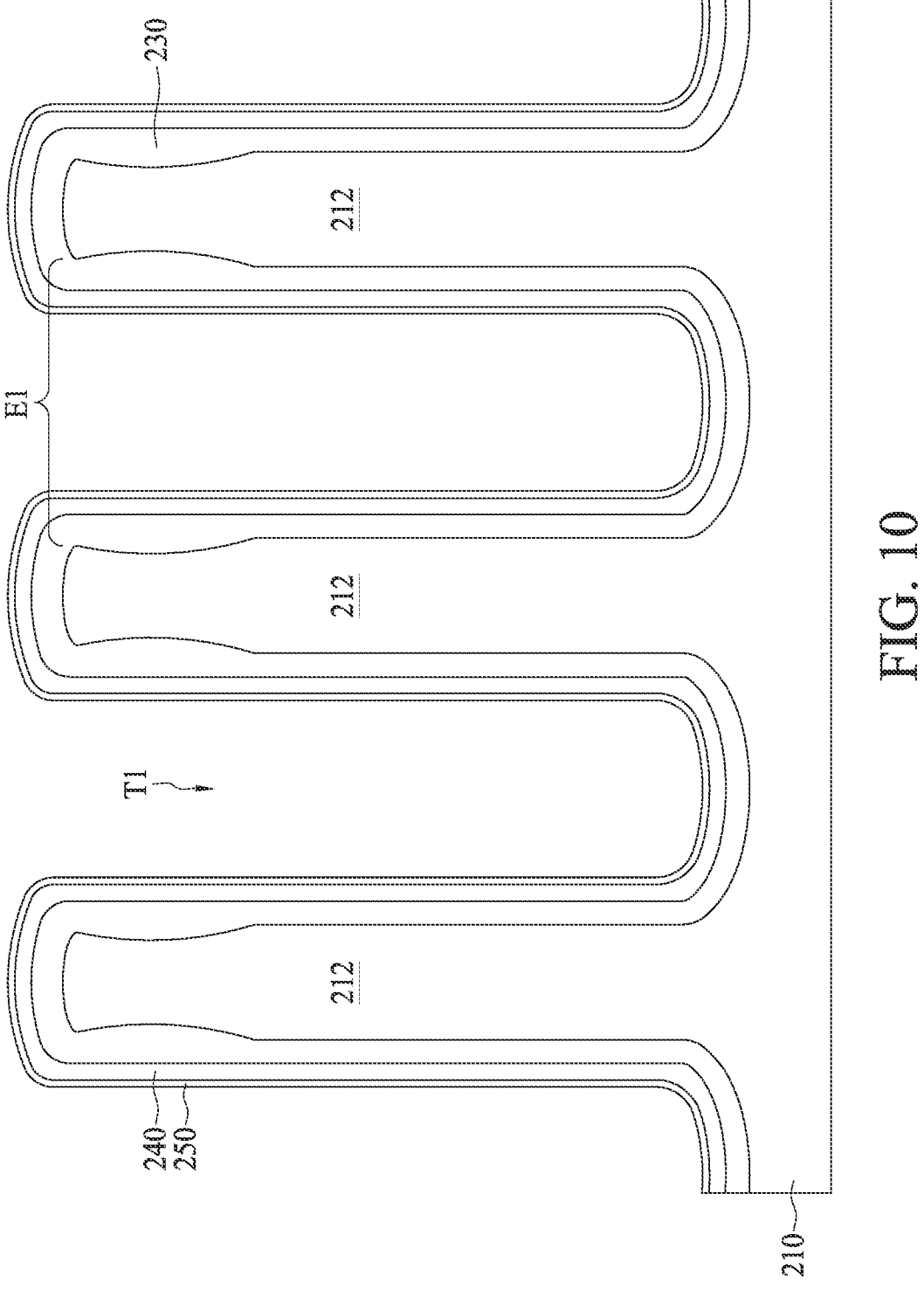

Referring to operation 309 of FIG. 2, a first dielectric layer 250 is deposited on the first conductive layer 240, as shown in FIG. 10. In some embodiments, the first dielectric layer 250 is conformally formed in the trenches T1, T2 and over the first conductive layer 240 using a chemical vapor deposition (CVD) operation or an ALD operation. In some embodiments, the first dielectric layer 250 includes one or more dielectric materials with high dielectric constants (high k) greater than that of silicon oxide (k>3.9). The first dielectric layer 250 may be made of SiN, SiON, $Al_2O_3$, $TiO_2$, $HfO_2$, $ZrO_2$, HfZrO, $HfO_xN_y$, $HfSi_xO_y$, $ZrO_xN_y$, $ZrSi_xO_y$, $HfSi_xO_yN_z$, $La_2O_3$, $Pr_2O_3$ or other suitable materials. In some embodiments, a thickness of the first dielectric layer 250 is less than 100 Å. The first dielectric layer 250 may have a dielectric constant ranging between 4 and 1000, with some embodiments having a dielectric constant of approximately 20. In some other embodiments, the first dielectric layer 250 includes a dielectric stack such as an oxide-nitride-oxide ("ONO") structure. In such embodiments, the thickness of the first dielectric layer 250 is about 20 angstroms (Å) to about 1000 Å according to the composition of oxide and nitride.

Figure 11:
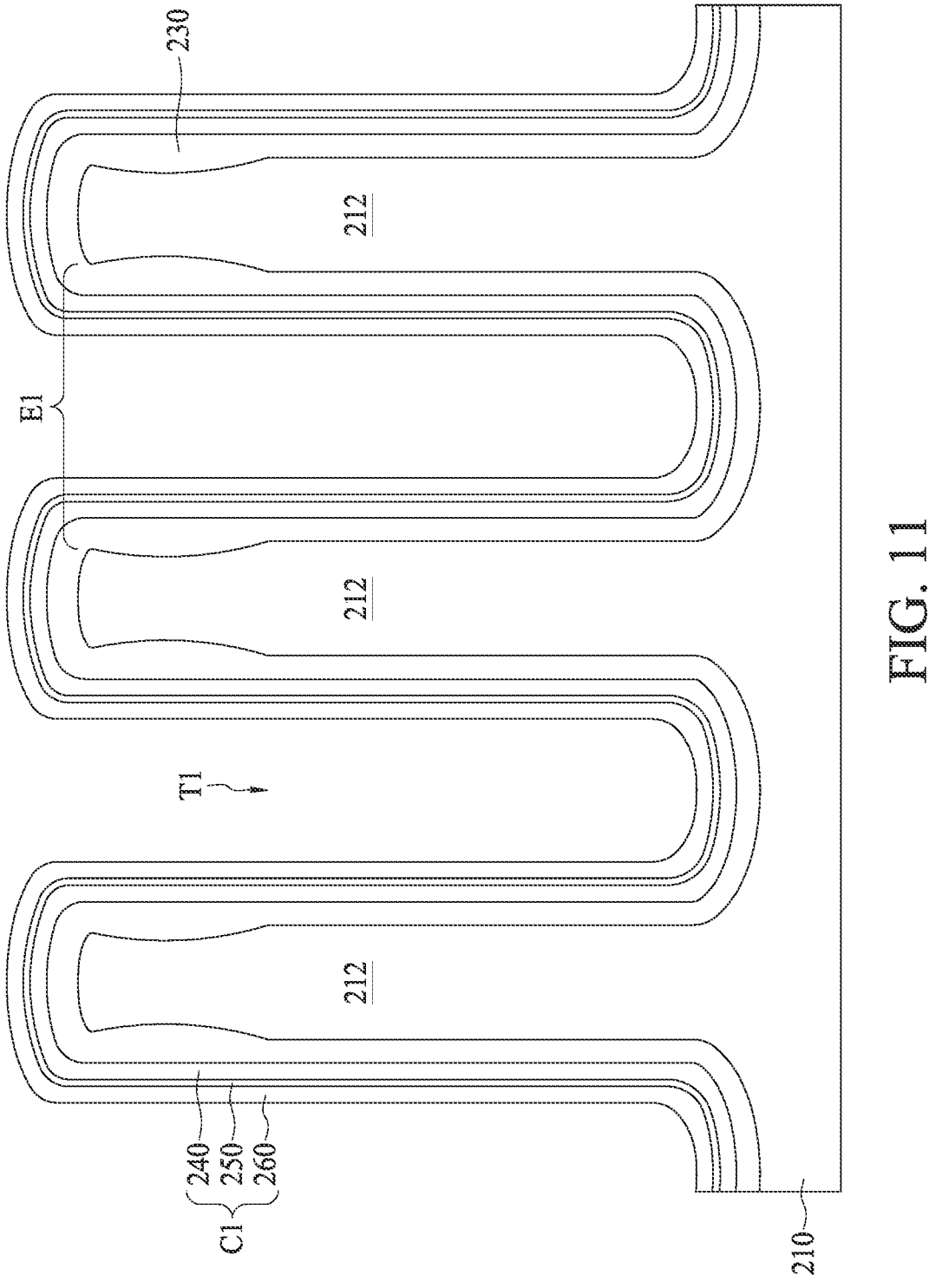
Figure 12:
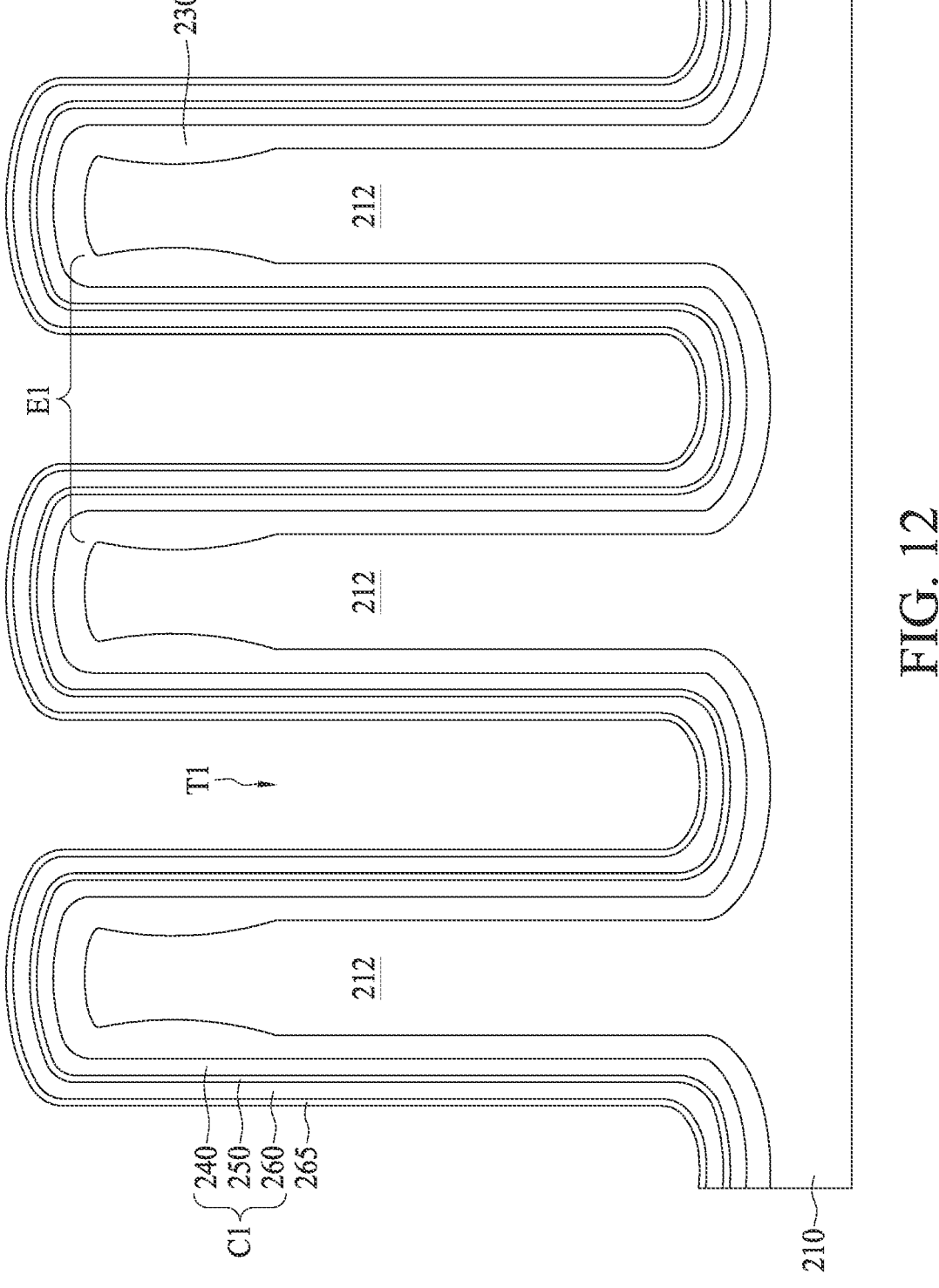

Referring to operation 311 of FIG. 2, a second conductive layer 260 is deposited on the first dielectric layer 250 to complete a first metal-insulator-metal (MIM) capacitor C1, as shown in FIG. 11. In some embodiments, the second conductive layer 260 is conformally formed in the trenches T1, T2 and over the first dielectric layer 250 using the same operation used to form the first conductive layer 240. The material and thickness of the second conductive layer 260 may be the same as or similar to those of the first conductive layer 240. The first conductive layer 240, the first dielectric layer 250 and the second conductive layer 260 may form a first MIM stack to establish the first MIM capacitor C1. The first MIM capacitor C1 is a deep trench capacitor and is of a capacitance capable of storing a high volume of electrons. The first conductive layer 240 and the second conductive layer 260 may respectively function as a bottom electrode and a top electrode of the first MIM capacitor C1. The first dielectric layer 250 which insulates the bottom electrode and the top electrode may be referred to as a capacitor dielectric. Capacitance of first MIM capacitor C1 may be derived by the following equation:

$$C = \varepsilon_r \varepsilon_0 \frac{A}{d}$$

In the above equation, A is an area of overlap of a pair of conductive capacitor plates (i.e., the area of overlap of the first conductive layer 240 and the second conductive layer 260). $\varepsilon_r$ is the relative static permittivity of the material between the plates (i.e., the relative static permittivity of the first dielectric layer 250), $\varepsilon_0$ is the electric constant, which is about $8.854 \times 10^{-12}$ F $m^{-1}$; and d is the distance separating the conductive capacitor plates.

As a result, when the first dielectric layer 250 becomes thinner (thus decreasing the distance between the conductive layers 240 and 260), or when the trenches T1, T2 become deeper (thus increasing the overlapping area of the conductive layers 240 and 260), the capacitance of first MIM capacitor C1 may be increased.

Referring to operation 313 of FIG. 2, a second dielectric layer 265 is formed on the second conductive layer 260, as shown in 12. In some embodiments, the second dielectric layer 265 is conformally formed in the trenches T1, T2 and over the second conductive layer 260 using the similar operation used to form the first dielectric layer 250. The material or configuration of the second dielectric layer 265 may be the same as or similar to those of the first dielectric layer 250. The thickness of the second dielectric layer 265 may be the same as or greater than that of the first dielectric layer 250.

Figure 13:
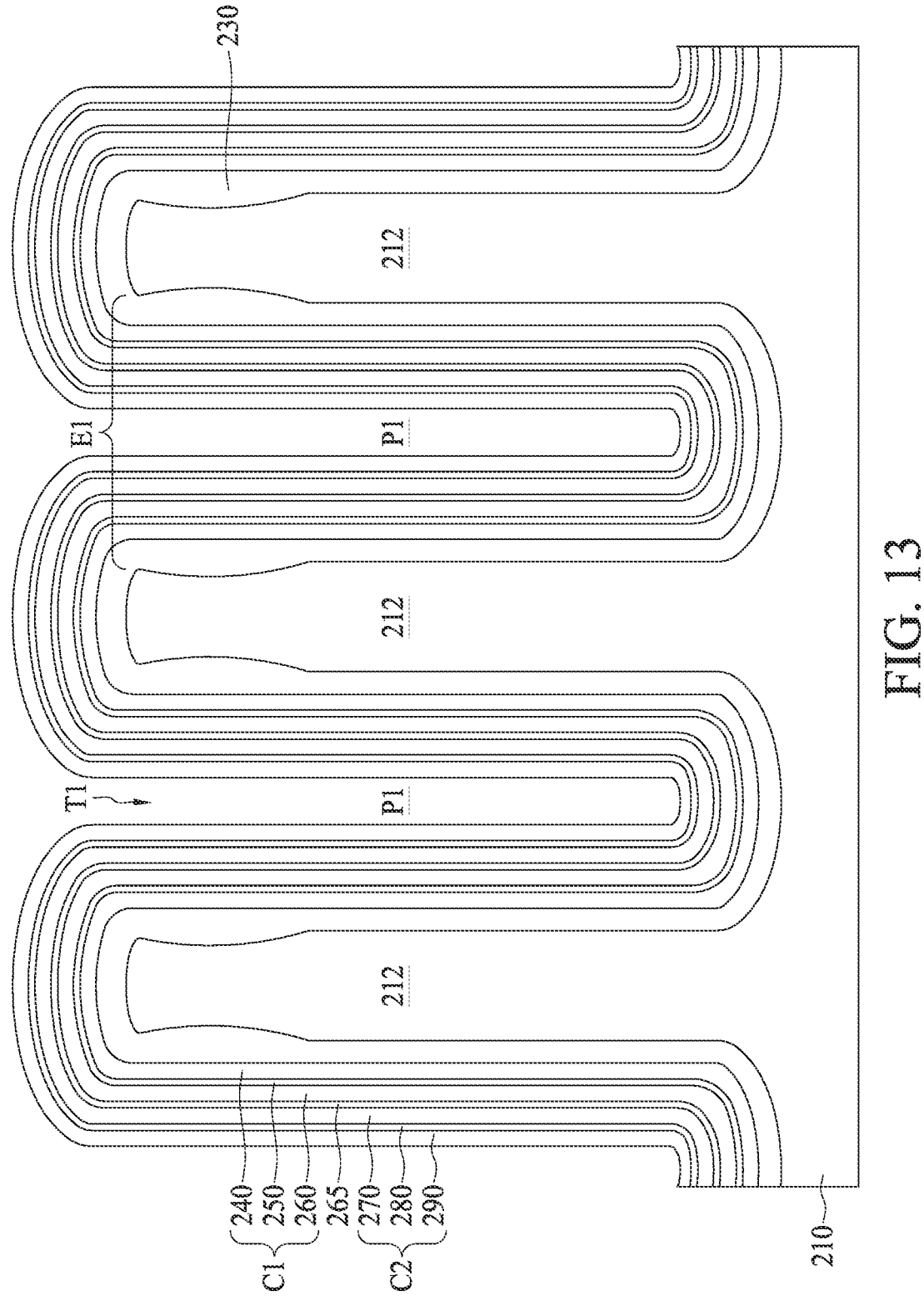

Referring to operation 315 of FIG. 2, a second MIM stack is formed on the second dielectric layer 265, as shown in FIG. 13. The second MIM stack includes a third conductive layer 270 and a fourth conductive layer 290, and a third dielectric layer 280 disposed therebetween. In some embodiments, the third conductive layer 270 is conformally formed over the second dielectric layer 265, the third dielectric layer 280 conformally formed over the third conductive layer 270, and the fourth conductive layer 290 conformally formed over the third dielectric layer 280. The third conductive layer 270, the third dielectric layer 280 and the fourth conductive layer 290 may be formed in succession using the same methods as operations 307, 309 and 311, respectively. The third conductive layer 270, the third dielectric layer 280 and the fourth conductive layer 290 may include substantially the same material as the first conductive layer 240, the first dielectric layer 250 and the second conductive layer 260, respectively. The second MIM stack may serve as a second MIM capacitor C2. The second MIM capacitor C2 is a deep trench capacitor and is of a capacitance capable of storing a high volume of electrons. The third conductive layer 270 and the fourth conductive layer 290 may respectively function as a bottom electrode and a top electrode of the second MIM capacitor C2. The third dielectric layer 280 which insulates the bottom electrode and the top electrode may be referred to as a capacitor dielectric. In some embodiments, the MINT capacitors C1, C2 do not completely fill the trenches T1, T2. A space P1 may be left in the trench T1 (or T2) and surrounded by the fourth conductive layer 290, as shown in FIG. 13. That is, the trenches T1 (T2) are still open and not sealed at this stage. In some embodiments, the space P1 is surrounded by the second MIM capacitor C2.

In some embodiments, the first MIM capacitor C1 and the second MIM capacitor C2 are trench capacitors disposed in parallel and vertically over one another. The bottom electrode of the second MIM capacitor C2 is directly disposed over the top electrode of the first MIM capacitor C1. The second dielectric layer 265 may physically and electrically isolates the first MIM capacitor C1 and the second MIM capacitor C2. The first MIM capacitor C1 and the second MIM capacitor C2 may form a double-MIM capacitor in the doped region 210 of the substrate 200. In some embodiments, the number of trench capacitors can be further increased according to different applications. For example, a third MIM capacitor may be stacked over the second MIM capacitor C2.

Figure 14:
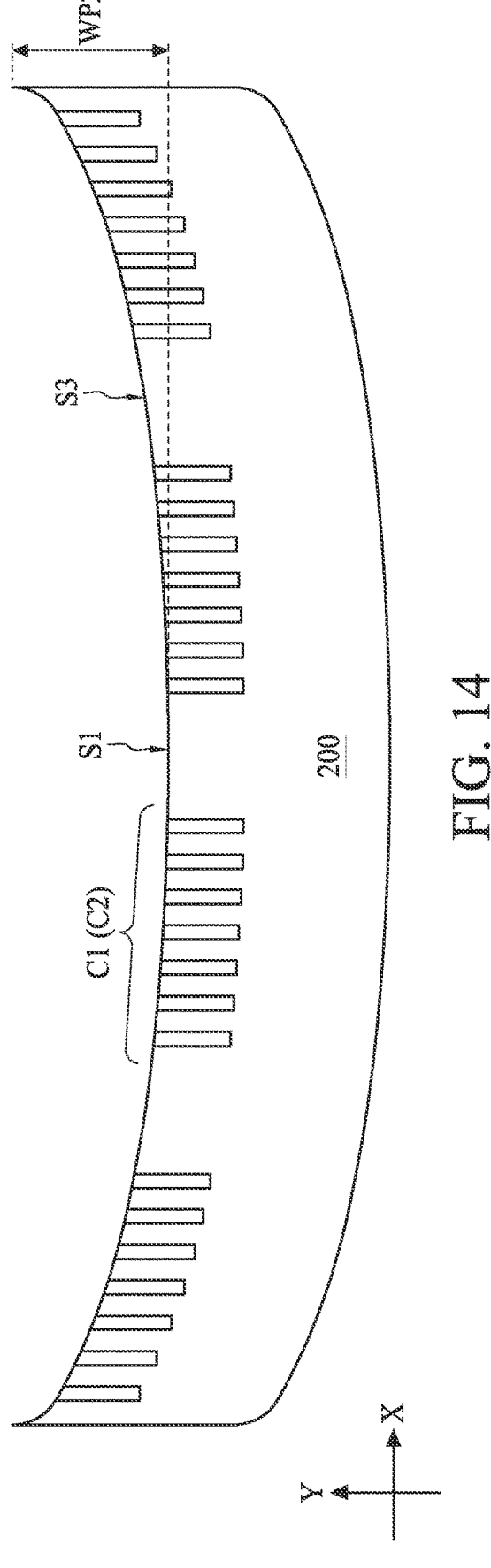
FIG. 14 is a schematic side view of a substrate including multiple MIM capacitors, in accordance with some embodiments of the present disclosure.

Referring to operation 316 of FIG. 2, a warpage level WP2 of the substrate 200 is determined or measured, as shown in FIG. 14, which is a schematic side view of the substrate 200 including the MIM capacitors C1 and C2. When multiple deep trench capacitors having a high capacitor density are arranged across the top surface S1 of the substrate 200 (which is, for example, a wafer), the front side of the substrate 200 may become closely packed compared to the back side the substrate 200. The disparate deep trench capacitor distributions between the front side and the back side of the substrate 200 causes a tensile stress to the substrate 200. As a result, the substrate 200 may bend in a concave manner or warp toward the positive Y-axis direction (herein referred to as a concave warpage) in a direction reverse to the convex warpage as shown in FIG. 6. In some embodiments, the warpage level WP2 of the substrate 200 is determined or measured as a difference between two degrees of warping when the substrate 200 is just provided and after the MIM capacitors C1, C2 are formed on the substrate 200. In some embodiments, the warpage level WP2 is defined as a concave warpage level WP2, which refers to a maximum degree to which a bending top surface S3 of the warped substrate 200 deviates from a flat top surface S1 of a freshly provided substrate 200. When the warpage level WP2 is close to zero or substantially zero, the substrate 200 remains substantially flat. When the warpage level WP2 is greater than or less than 0, the substrate 200 is warped. In some embodiments, as the density of deep trench capacitors increases, the warpage level WP2 of the concave or downward warpage of the substrate 200 also increases. The warpage level WP2 of the substrate 200 after the formation of the MIM capacitors C1, C2 may be up to about 200 μm.

Referring to FIGS. 6 and 14, in some embodiments, the previous (convex) warpage level WP1 of the substrate 200 during the formation of the trenches T1, T2 is countered by the subsequent (concave) warpage level WP2 of the substrate 200 after the formation of the MIM capacitors C1, C2. In such embodiments, the warpage toward the negative Y-axis direction is counterbalanced by the warpage toward the positive Y-axis direction. That is, the warpage level WP1 is substantially equal to the warpage level WP2 (WP1=WP2). Therefore, the substrate 200 may become substantially flat after the MIM capacitors C1, C2 are formed. In some embodiments, the warpage level WP1 is not countered by the warpage level WP2. When more MIM capacitors are formed over the substrate 200, the presence of the MIM capacitors may cause more concave warpage. When the warpage level WP2 is greater than the warpage level WP1 (WP2>WP1) after the formation of the MIM capacitors C1, C2, the substrate 200 still warps toward the positive Y-axis direction. Referring back to FIG. 13, when compared with a smaller space P1 left in the trench T1 (or T2) during the formation of the MIM capacitors C1, C2, a larger space P1 left in the trench T1 (or T2) during the formation of the MIM capacitors C1, C2 may not further increase the warpage level WP2 of the substrate 200. That is, a larger space P1 may be able to prevent the concave warpage of the substrate 200 from deterioration. The warpage level WP2 of the substrate 200 may be associated with the size of the space P1.

In some other embodiments, if the warpage level WP2 is less than the warpage level WP1 (WP2<WP1) after the formation of the MIM capacitors C1, C2, the substrate 200 still warps toward the negative Y-axis direction, it is determined that less space P1 should be left in the trench T1 (or T2). In such embodiments, the thickness of each layer of the MIM capacitors C1, C2 is increased or a filling material is deposited into the space P1 to reduce the space P1 such that more concave warpage can be generated to compensating for the convex warpage.

Figure 15A:
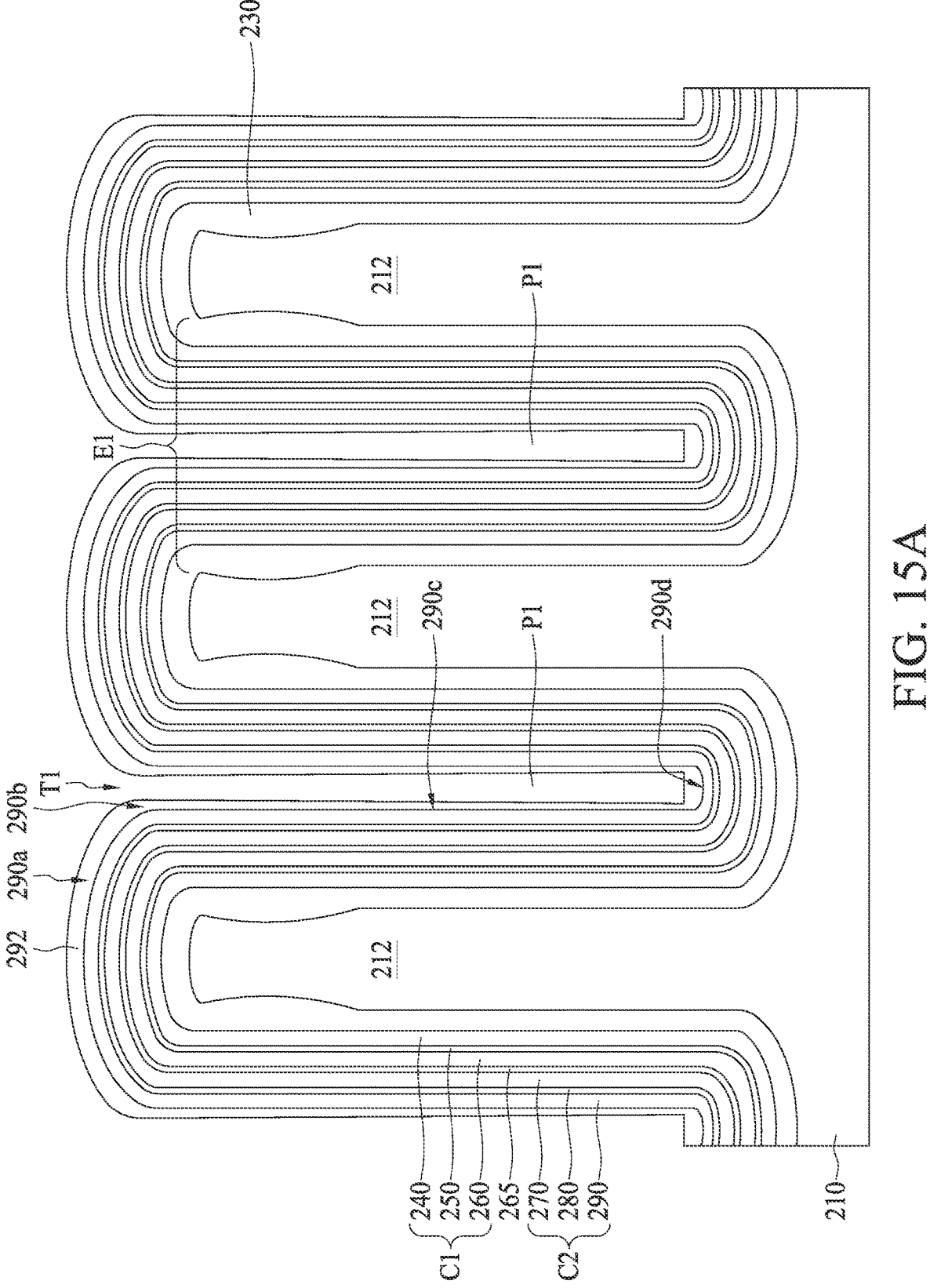
Figure 15B:
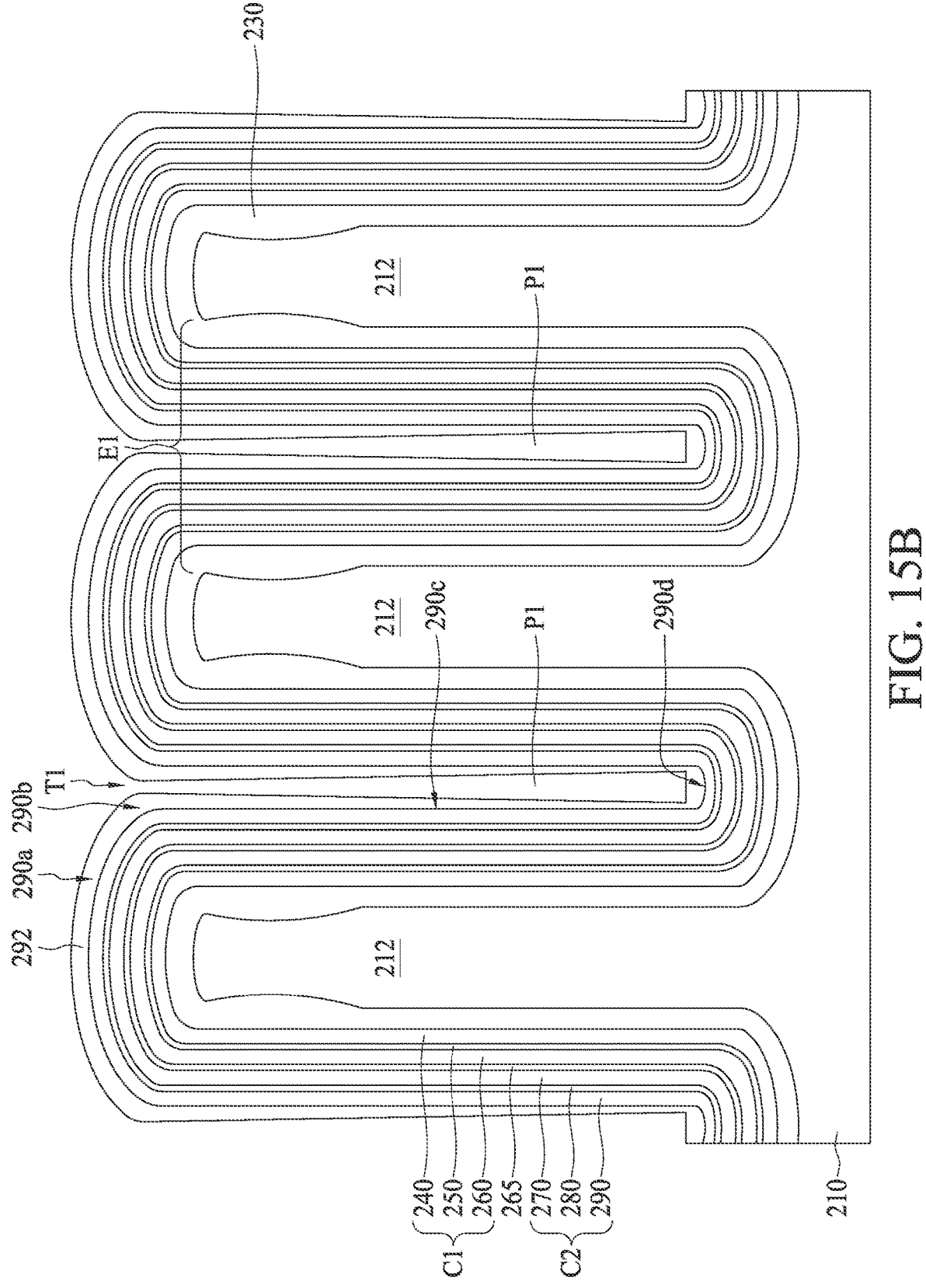
Figure 15C:
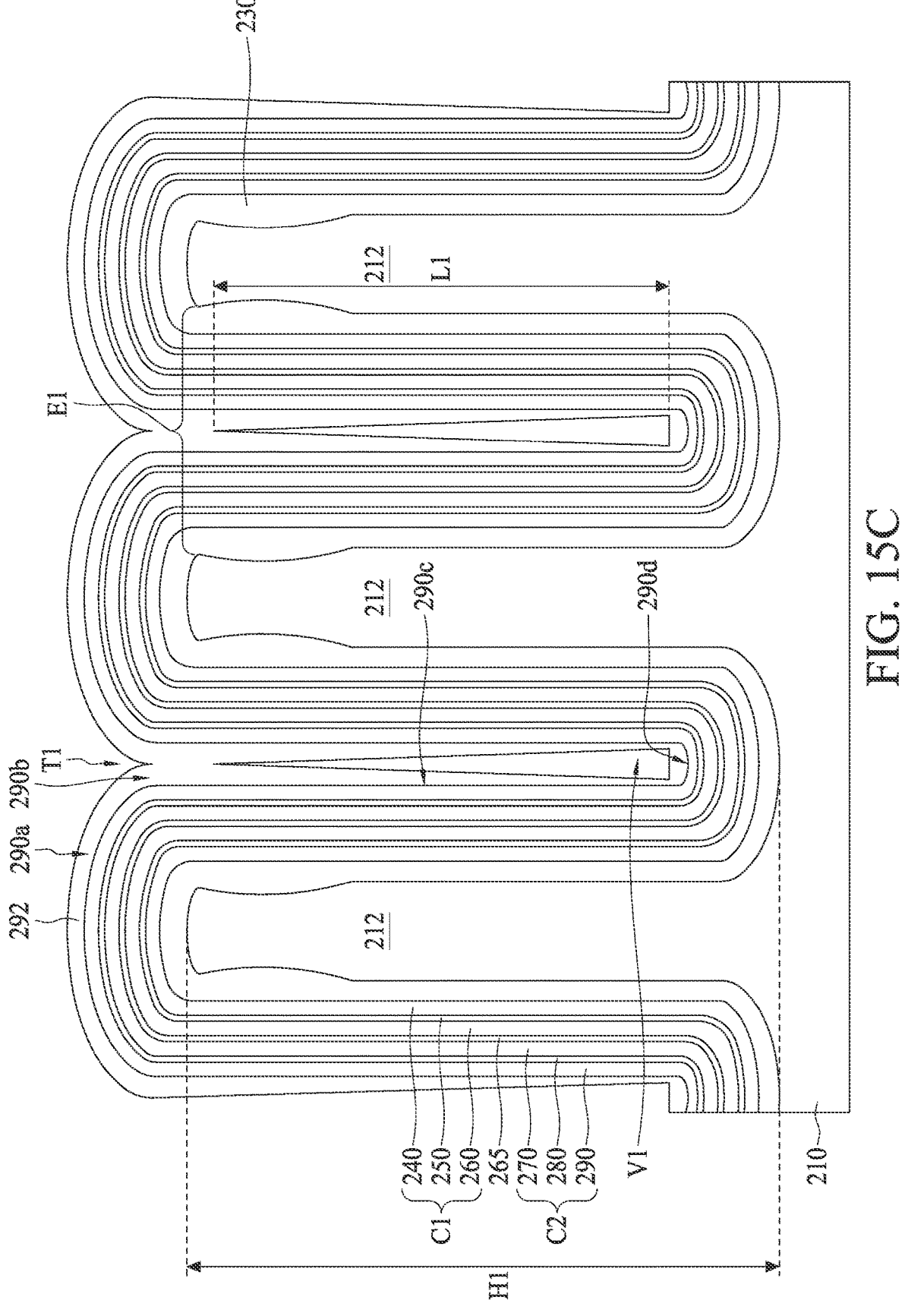

Referring to operation 317 of FIG. 2, an insulating layer 292 is deposited on the second MIM capacitor C2, as shown in FIGS. 15A to 15C. The trenches T1, T2 must be sealed to prevent materials used in subsequent operations such as photoresist or distilled water from entering the trenches T1, T2. The insulating layer 292 may be formed on a top surface 290a, a corner 290b, a side-wall surface 290c and a bottom surface 290d of the fourth conductive layer 290 of the second MIM capacitor C2. In some embodiments, the insulating layer 292 is formed using a CVD operation such as plasma-enhanced CVD (PECVD). The material of the insulating layer 292 may include silicon oxide, silicon nitride, silicon carbide, undoped silicate glass (USG), boro-silicate glass (BSG), tetraethoxysilane (TEOS), a low-k material, or materials of an anti-reflection layer. In some embodiments, the insulating layer 292 is used to seal the trenches T1, T2 and retain the space P1 (as shown in FIG. 13). Since the warpage level WP2 of the substrate 200 is associated with the size of the space P1, the insulating layer 292 is used to cover the space P1 rather than fill the space P1. Thus, in some embodiments, the insulating layer 292 is not formed using an ALD operation because the ALD operation has a better gap filling ability to thereby fill the space P1.

As shown in FIG. 4C, the aspect ratio of the trenches T1 and T2 is extremely high. As such, the product (deposit) generated by the chemical reaction of gas precursors in the CVD operation is difficult to enter the trenches T1 through the entrances E1 or enter the trenches T2 through the entrances E2. As a result, a greater amount of the deposited insulating layer 292 is accumulated on the top surface 290a and the corner 290b, while a less amount of the insulating layer 292 is coated on the sidewall surface 290c and the bottom surface 290d, as shown in FIG. 15A.

Referring to FIG. 15B, as the insulating layer 292 accumulated on the fourth conductive layer 290 becomes thicker, the portions of insulating layer 292 formed on opposite upper corners 290b facing the same trench T1 or T2 approach each other, although the trenches T1 in FIG. 15B are still open.

Referring to FIG. 15C, after a predetermined time of deposition, the portions of the insulating layer 292 on opposite corners 290b come into contact. That is, at such time, the portions of the insulating layer 192 formed over opposite corners of two neighboring fins 21 become thick enough to contact each other. As a result, the trenches T1 and T2 are sealed by the insulating layer 292. In some embodiments, once all of the trenches T1 and T2 are sealed by the insulating layer 292, the CVD operation is stopped. In some embodiments, the insulating layer 292 has different thicknesses over the fourth conductive layer 290 in the trenches T1 (or T2) at different heights. Due to the uneven thickness of the insulating layer 292 in the trenches T1 (or T2), multiple voids V1 may be formed within the insulating layer 292, that is, the insulating layer 292 in the trenches T1 and T2 may be hollow. Each of the voids V1 may be tubular.

In some embodiments, the void V1 has a similar function to the space P1. Larger voids V1 may be able to prevent the warpage level WP2 of the concave warpage in the substrate 200 from deterioration. Further, in response to the substrate 200 warping toward the positive Y-axis direction, the size of the voids V1 is dependent on the thicknesses W1, W2 of the insulating layer 292 within the trenches T1, T2. In some embodiments, the size and profile of the voids V1 are controllable by adjusting process parameters in the formation of the insulating layer 292. In some embodiments, when a large warpage level WP2 of the substrate 200 is determined in operation 316, the process parameters of the CVD operation is adjusted to decrease the deposition thickness of insulating layer 292 within the trenches T1, T2. In some other embodiments, when a warpage level WP2 of the substrate 200 is determined in operation 316, the process parameters of the CVD operation are adjusted to allow the insulating layer 292 within the trenches T1, T2 to be deposited to a predetermined thickness. For example, the flow rate of gas precursors, the deposition rate of formed deposits, the deposition temperature or pressure in a chamber for performing the CVD operation, and the like may be controlled.

In order to form larger voids V1 in the trenches T1 and T2, in some embodiments, the flow rate of the gas precursors for forming the insulating layer 292 is greater than about 10 sccm. The high flow rate facilitates the formation of larger voids V1. In some embodiments, the temperature at which the process gas is used to form the insulating layer 292 is between about 300° C. and about 400° C. In some embodiments, the pressure at which the process gas is used to form the insulating layer 292 is between about 0 torr and about 5 torr. Therefore, in order to leave larger voids V1 in the trenches T1, T2, the amount of the insulating layer 192 is carefully controlled. Thus, the warpage level of the substrate 200 is not only associated with the size of the voids V1, but also associated with the thicknesses W1, W2 of the insulating layer 292 within the trenches T1, T2. As a result, the presence of voids V1 with well-managed dimensions may reduce the likelihood of wafer warpage and keep the wafer substantially flat. A subsequent wafer CMP operation, a photo-alignment operation, or a bonding operation can be performed smoothly on the wafer, thereby improving the chip yields.

Figure 15D:
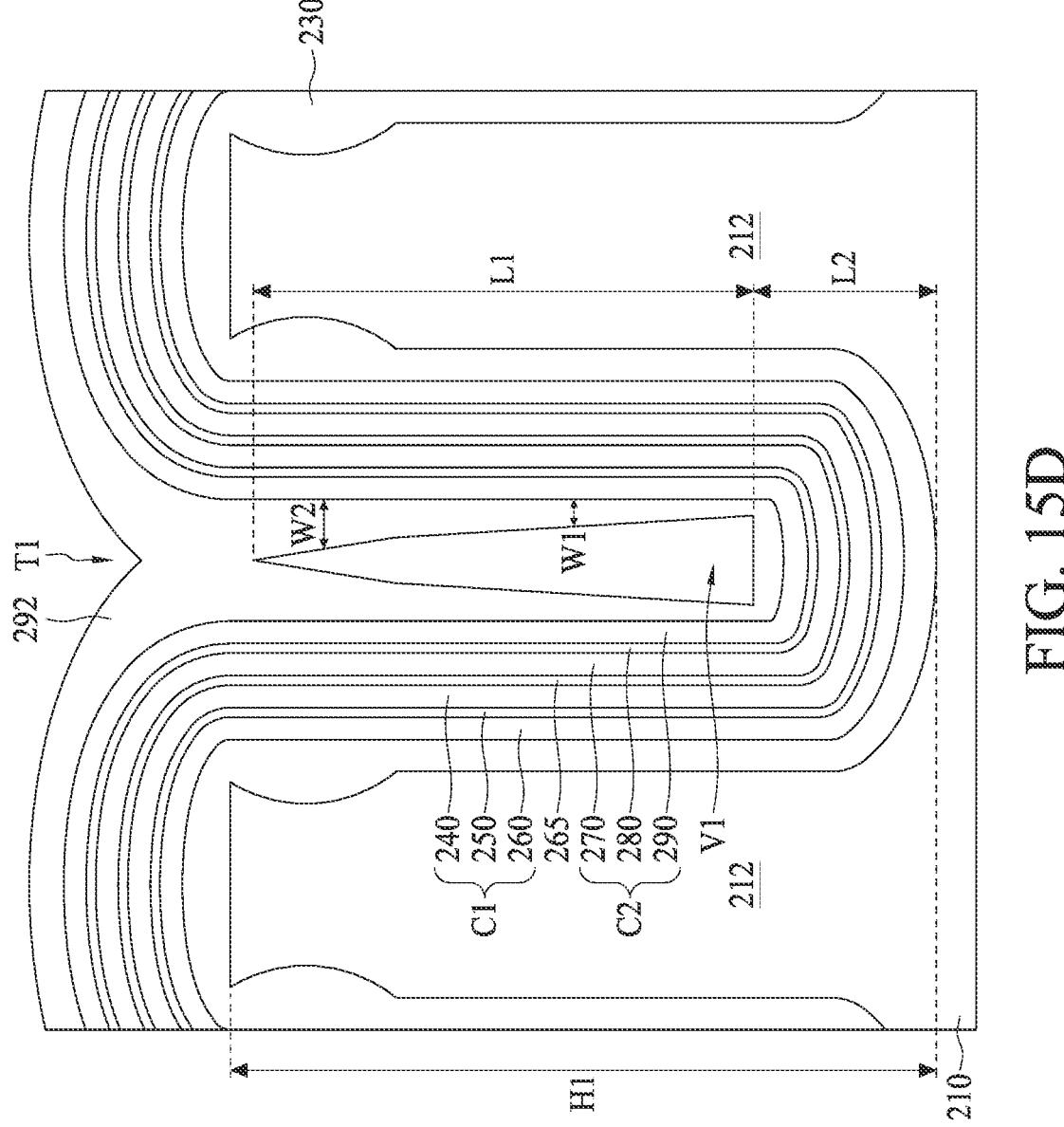

FIG. 15D is an enlarged view showing one of the voids V1 in FIG. 15C. In some embodiments, a thickness W2 of the insulating layer 292 covering an upper portion of the fourth conductive layer 290 in the top half of the trench T1 is between about 15 nm and about 22 nm. In some embodiments, a thickness W3 of the insulating layer 292 covering a lower portion of the fourth conductive layer 290 in the bottom half of the trench T1 is between about 4 nanometers (nm) and about 10 nm. In some embodiments, a height L1 of the void V1 is equal to or more than 0.95 times the depth H1 of the trench T1. The void V1 may have different diameters at different heights. In some embodiments, the void V1 tapers toward the entrance E1, of the trench T1. In some embodiments, a distance L2 between a bottommost point of the void V1 and a bottommost point of the trench T1 is about 100 nm.

In some embodiments, compared with an ALD operation, larger voids V1 are formed using the CVD operation for forming the insulating layer 292. Deposit molecules of the insulating layer 292 formed by the CVD operation may occupy a larger volume than those formed by other deposition methods, e.g., ALD, given the same deposition time. The many deposit molecules may not enter the trenches T1, T2 easily and tend to accumulate at the top surface 290a and the corner 290b of the fourth conductive layer 290. As a result, when the entrances E1, E2 of the trenches T1, T2 are fully occupied by the deposit molecules, the trenches T1, T2 are closed or sealed. No more deposit molecules of the insulating layer 292 can enter the trenches T1, T2. Thus, only a small amount of the insulating layer 292 is coated on the sidewall surfaces 290c, thereby generating larger voids V1.

Figure 16:
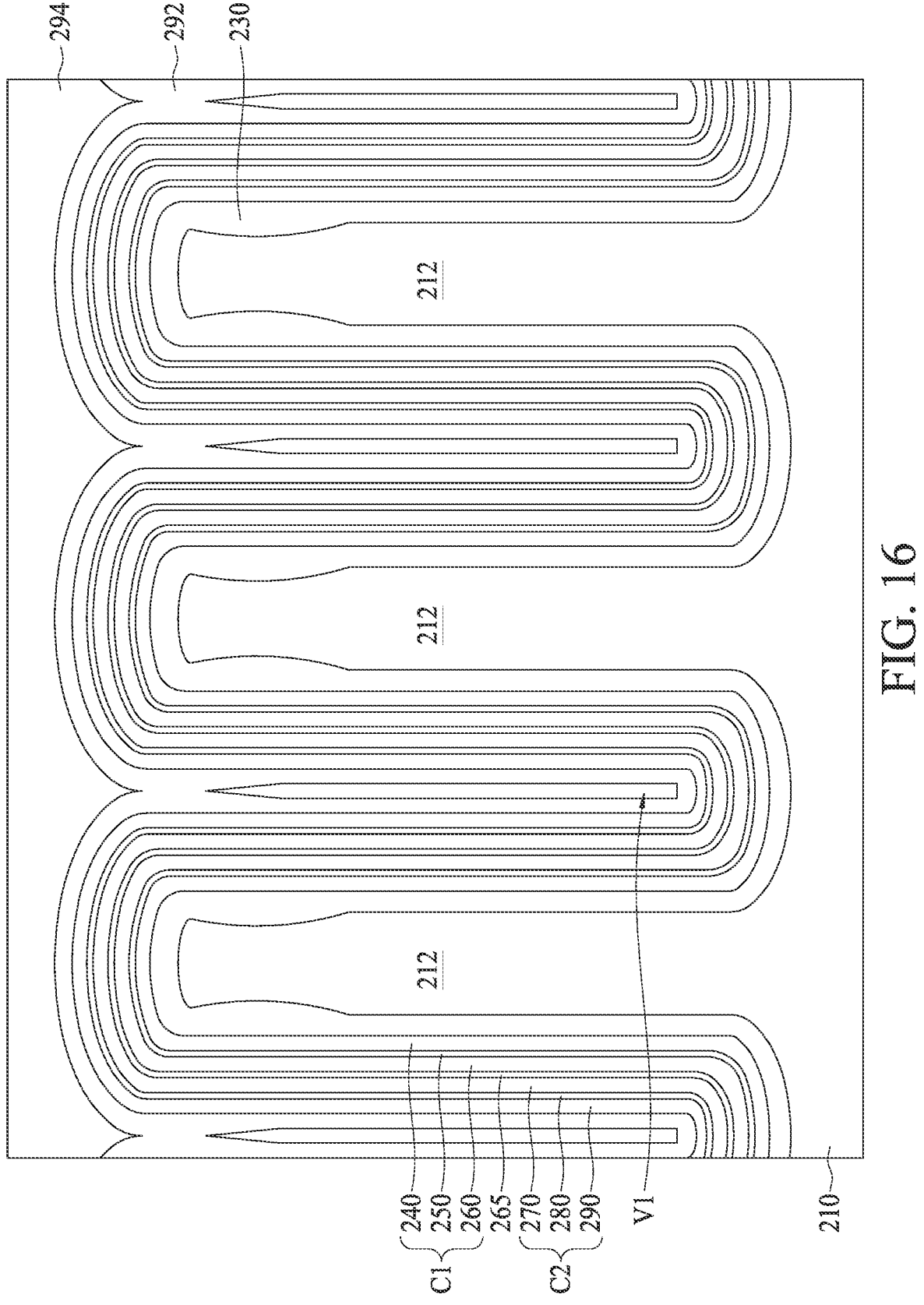

Referring to operation 319 of FIG. 2, an inter-layer dielectric (ILD) layer 294 is deposited on the insulating layer 292, as shown in FIG. 16. Since the insulating layer 292 tends to seal the trenches T1, T2 before the trenches T1 and T2 are filled, the insulating layer 292 may have an uneven top surface. In some embodiments, the ILD layer 294 is used to compensate for the uneven top surface of the insulating layer 292 to create a flat surface for subsequent operations. The ILD layer 294 may be formed by depositing an insulating material onto the insulating layer 292 using spin-on coating, CVD, and/or other suitable methods. The insulating material of the ILD layer 294 may include the same or similar material as that of the insulating layer 292. A CMP operation may be used to level the top surface of the ILD layer 294.

Figure 17:
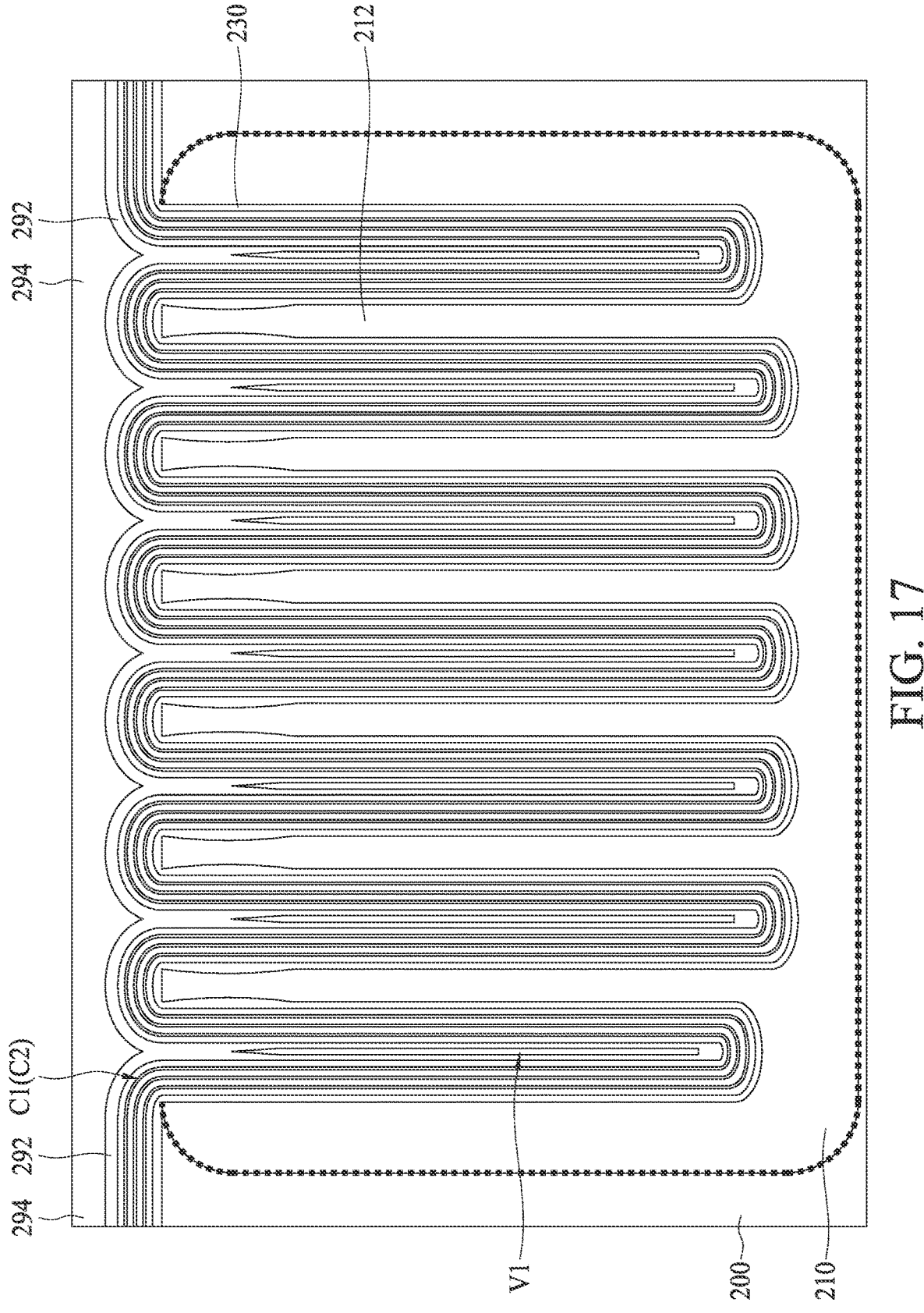

FIG. 17 shows a schematic cross-section view of all the trenches T1, T2 and the MIM capacitors C1, C2 after operation 319. In some embodiments, the second MIM capacitor C2 is disposed in parallel to and vertically over the first MIM capacitor C1. In some embodiments, the first MIM capacitor C1 and the second MIM capacitor C2 extend over the doped region 210 and the substrate 200. The insulating layer 292 covers the second MIM capacitor C2, and the ILD layer 294 covers the insulating layer 292.

Figure 18:
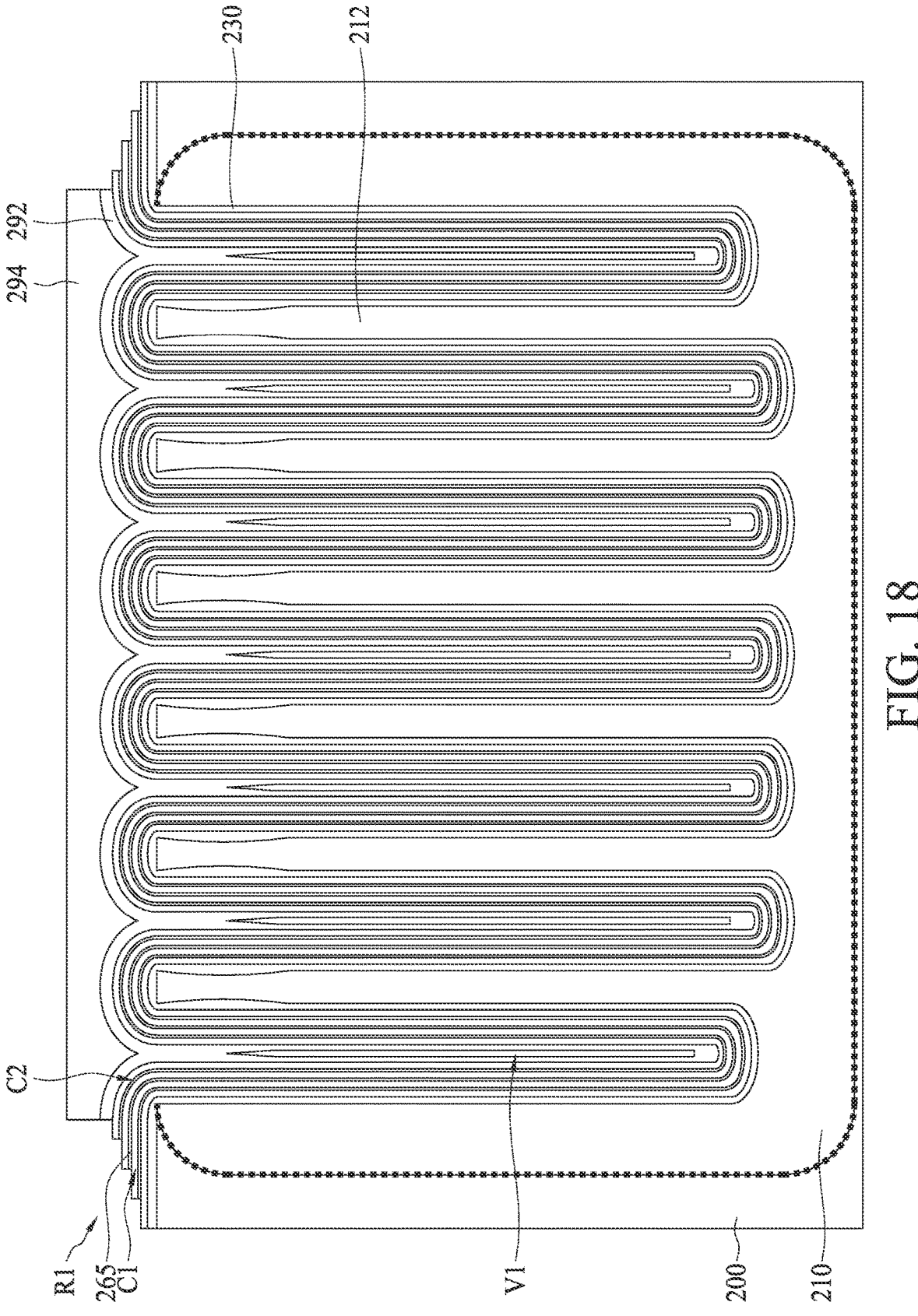

Referring to operation 321 of FIG. 2, an opening R1 is formed in the first and second MIM capacitors C1, C2, as shown in FIG. 18. The formation of the opening R1 may include a series of lithographic and etch operations. In some embodiments, portions of the first MIM capacitor C1, the second dielectric layer 265, the second MIM capacitor C2, the insulating layer 292 and the ILD layer 294 over the substrate 200 are removed using etch operations in succession. The formed opening R1 may expose the underlying liner layer 230 on the substrate 200 and the second dielectric layer 265 on the first MIM capacitor C1. In some embodiments, the multi-step etch operation makes the MIM capacitors C1, C2 have a step structure at their portions outside the doped region 210.

Figure 19:
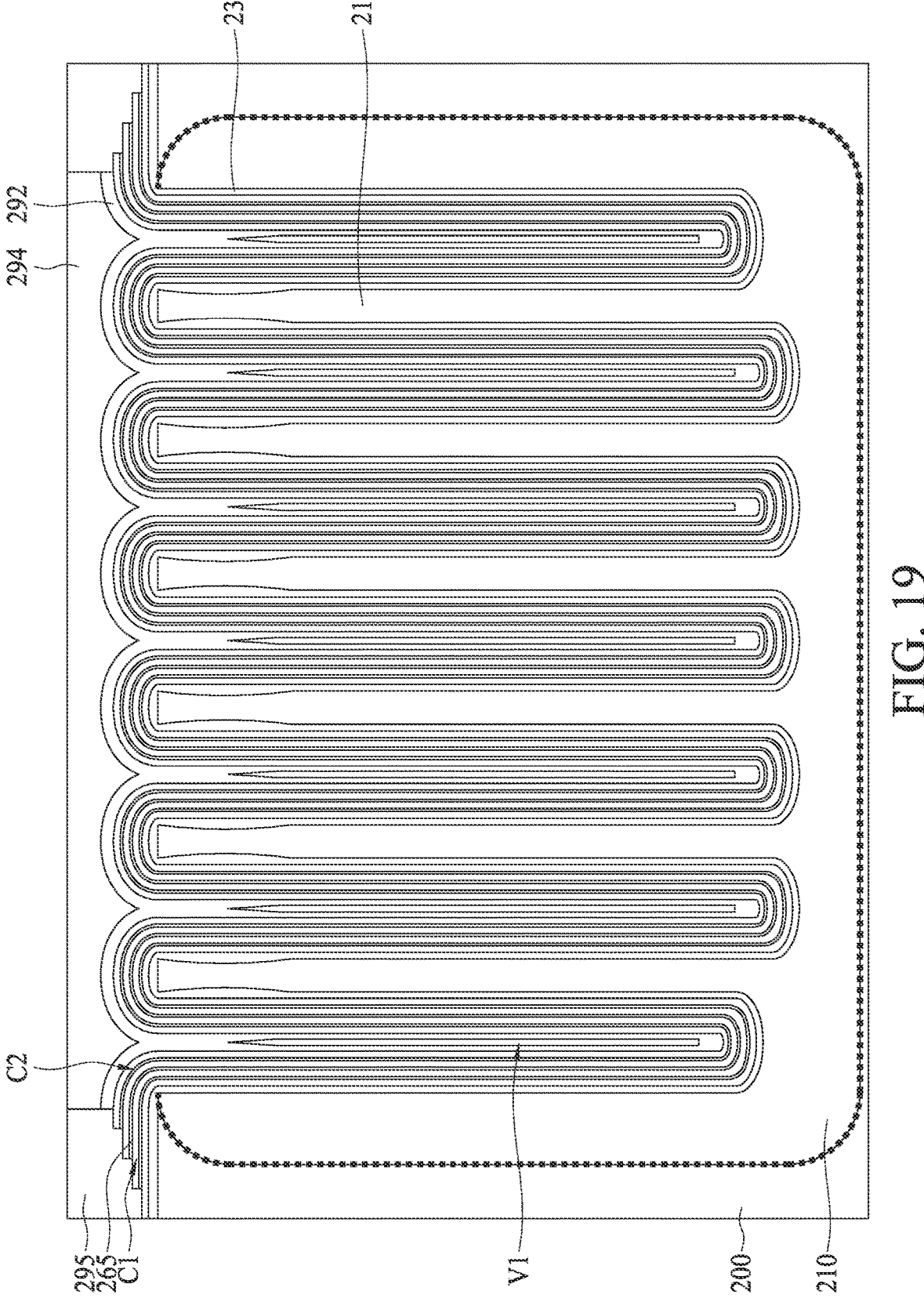

Referring to operation 323 of FIG. 2, an isolation layer 295 is filled into the opening R1, as shown in FIG. 19. The isolation layer 295 may be formed by depositing a dielectric material over the liner layer 230, the first MIM capacitor C1 and the second MIM capacitor C2 using a CVD operation, a PVD operation and/or other suitable methods. In some embodiments, the dielectric material of the isolation layer 295 includes silicon oxide, silicon nitride, silicon oxynitride, silicon carbide, or other suitable materials. The isolation layer 295 may contact the insulating layer 292 and the ILD layer 294.

Figure 20:
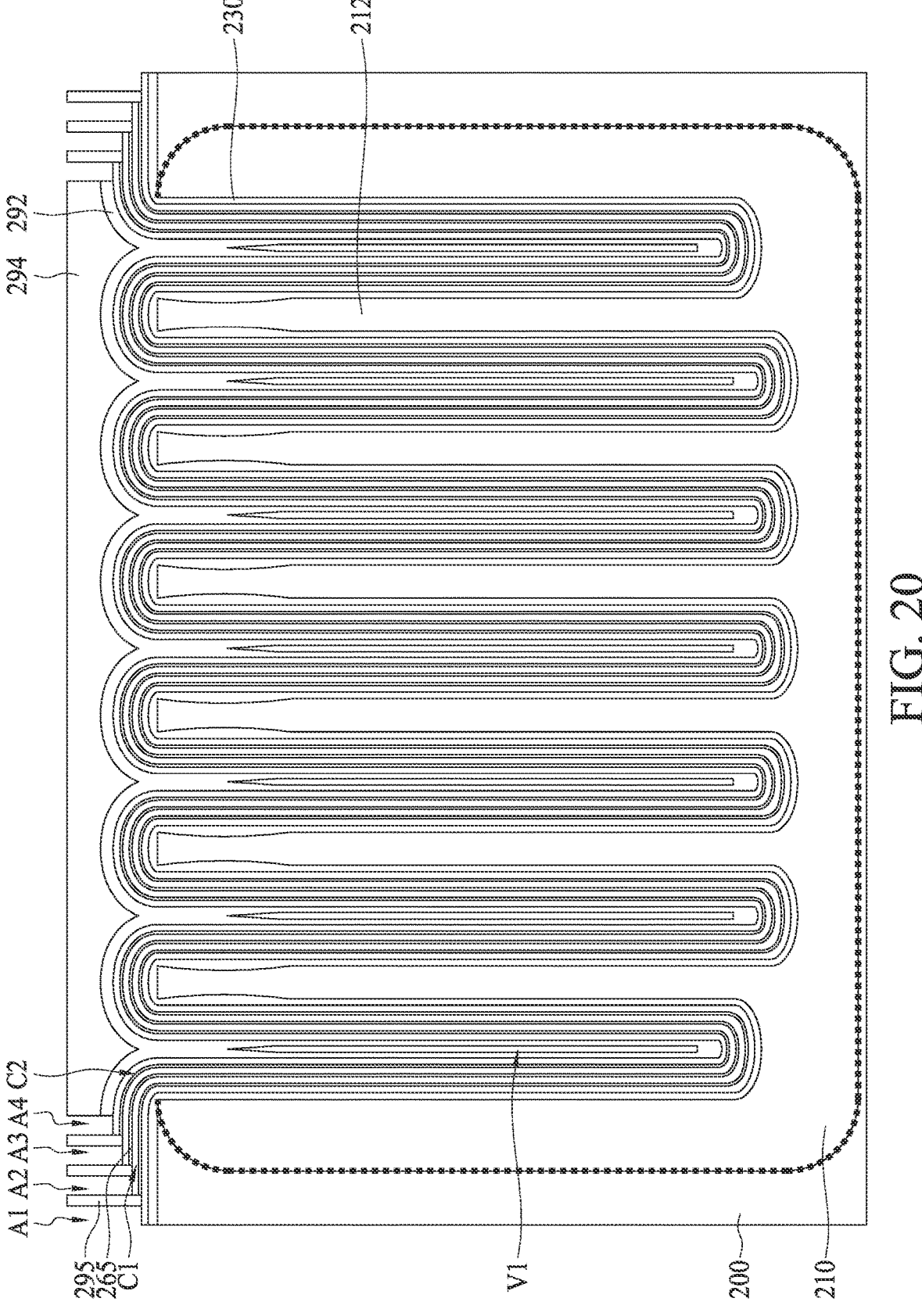

Referring to operation 325 of FIG. 2, multiple contact holes A1, A2, A3 and A4 are formed in the isolation layer 295, as shown in FIG. 20. The formation of the contact holes A1, A2, A3 and A4 may include a series of lithographic and etch operations. Portions of the isolation layer 295 may be removed using etch operations in succession. In some embodiments, the formed contact holes A1 and A2 expose portions of the first MIM capacitor C1 and the liner layer 230 previously covered by the isolation layer 295. In some embodiments, the formed contact holes A3 and A4 exposes portions of the second MIM capacitor C2, the second dielectric 265, the insulating layer 292 and the ILD layer 294 previously covered by the isolation layer 295. The contact holes A1, A2, A3 and A4 may be separated by the remaining isolation layer 295.

Figure 21:
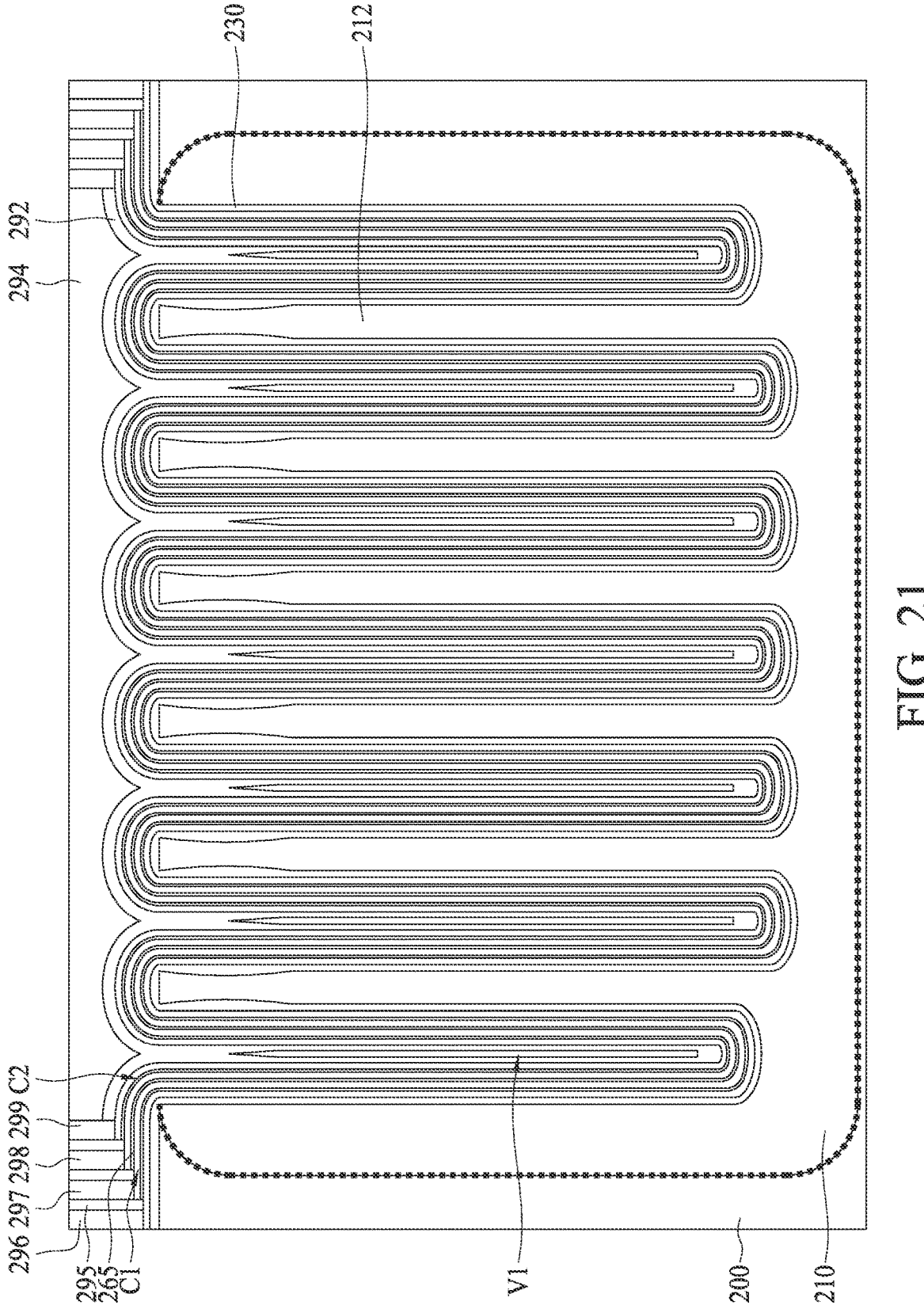

Referring to operation 327 of FIG. 2, multiple conductive vias 296, 297 and 298 are respectively formed in the contact holes A1, A2, A3 and A4, as shown in FIG. 21. A conductive material may deposited into the contact holes A1, A2, A3 and A4 using electroplating, PVD, CVD, and/or other suitable methods. The conductive material may include one or more conductive materials, such as tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au), or other suitable materials. As such, the conductive via 296 is formed in the contact hole A1, the conductive via 297 is formed in the contact hole A2, the conductive via 298 is formed in the contact hole A3, and the conductive via 299 is formed in the contact hole A4. In some embodiments, the conductive via 296 is electrically coupled to the bottom electrode of the first MIM capacitor C1, the conductive via 297 is electrically coupled to the top electrode of the first MIM capacitor C1, the conductive via 298 is electrically coupled to the bottom electrode of the second MIM capacitor C2, and the conductive via 299 is electrically coupled to the top electrode of the second MIM capacitor C2. The conductive vias 296, 297, 298 and 299 may be electrically isolated by the isolation layer 295. At this stage, the formation of the semiconductor device 20 is completed.

Figure 22:
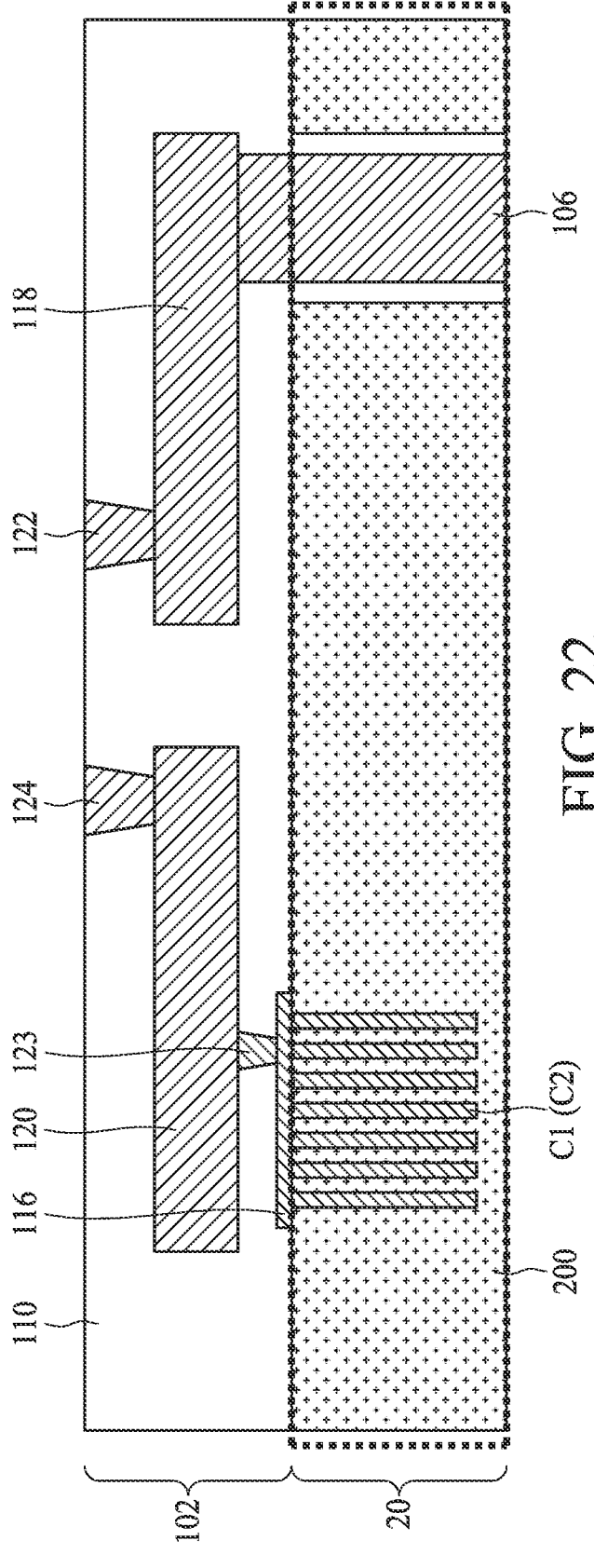
FIG. 22 is a schematic cross-sectional view showing an interconnect structure formed over the semiconductor device in FIG. 1A.

Subsequent operations may be performed on the semiconductor device 20 to fabricate other devices or interconnect structures over the semiconductor device 20, FIG. 22 is a schematic cross-sectional view showing an interconnect structure 102 formed over the semiconductor device 20. The formation of the interconnect structure 102 may include a series of lithographic, etch, deposition and planarization operations. The interconnect structure 102 includes multiple horizontal conductive lines 116, 118, 120 and multiple vertical conductive vias 122, 123, 124 surrounded by an insulation layer 110. The insulation layer 110 may include a dielectric material. In the interconnect structure 102, the topmost conductive via 124 may be electrically coupled to the bottommost conductive line 116 through the conductive line 120 and the conductive via 123, and the conductive via 122 may be electrically coupled to the conductive line 118. A conductive via 106 may be formed to penetrate the substrate 200 and connected to the conductive line 118 of the interconnect structure 102. The conductive via 106 may extend in the insulation layer 110. In some embodiments, the conductive via 106 is referred to as a backside through silicon via (BTSV).

Referring to FIGS. 21 and 22, in some embodiments, the conductive line 116 is formed over the conductive vias 297, 298 for electrical interconnections. The formation of the conductive line 116 may include depositing a conductive material on the IUD layer 294 and the conductive vias 297, 298 using electroplating, PVD, CVD, and/or other suitable methods. The conductive material of the conductive line 116 may be the same as or similar to that of the conductive vias 297, 298. The conductive line 116 may be electrically coupled to the conductive vias 297 and 298. In some embodiments, the conductive line 116 is electrically coupled to the first MIM capacitor C1 via the conductive vias 297. In some embodiments, the conductive line 116 is electrically coupled to the second MIM capacitor C2 via the conductive vias 298. The conductive via 106 is spaced apart from the MIM capacitors C1, C2. In some embodiments, the MIM capacitors C1 and C2 are electrically coupled to the conductive via 106 through the interconnect structure 102.

Figure 23:
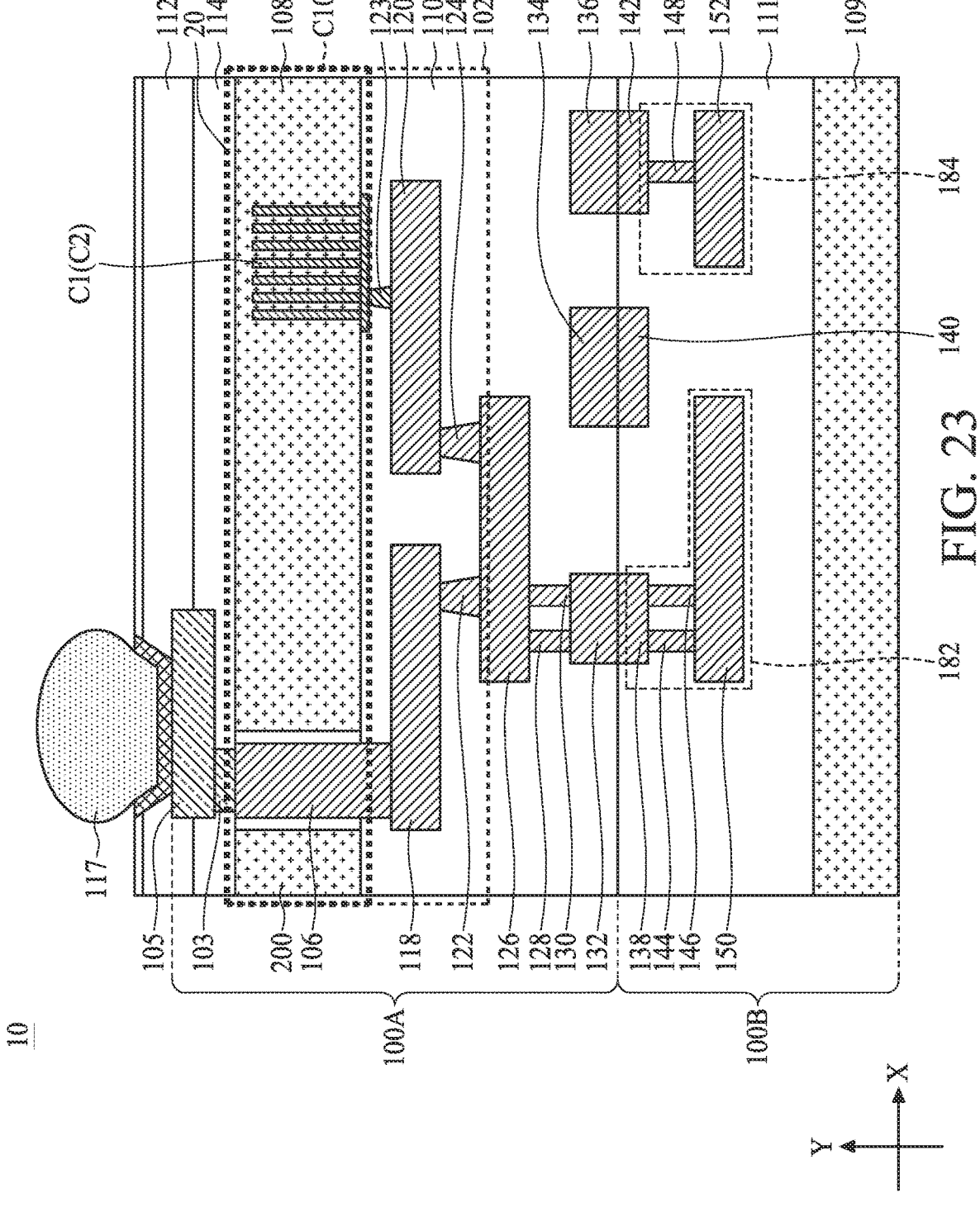
FIG. 23 is a schematic cross-sectional view showing a semiconductor structure including the semiconductor device in FIG. 1A and the interconnect structure in FIG. 21.

FIG. 23 is a schematic cross-sectional view showing a semiconductor structure 10 including the semiconductor device 20 and the interconnect structure 102. The semiconductor structure 10 includes a semiconductor structure 100A and a semiconductor structure 100B. The semiconductor structure 100A or 100B can be in the form of a wafer, a chip, a die or other suitable semiconductor structure. The semiconductor structure 100A is disposed above the semiconductor structure 100B. The semiconductor structure 100A is formed on the semiconductor structure 100B along the Y direction. The semiconductor structure 100A is electrically coupled with the semiconductor structure 100B. The semiconductor structure 100A is in electrically contact with the semiconductor structure 100B. The semiconductor structure 100A is in directly contact with the semiconductor structure 100B.

The semiconductor structure 10 can be wafer-on-wafer (WOW) configuration with the semiconductor structure 100A bonded to the semiconductor structure 100B. WOW devices have been widely used for various applications, such as artificial intelligence (AI) application that utilizes high performance computing. In WOW devices, a large capacitor is sometimes utilized to facilitate stable operations of the semiconductor devices, which may increase routing costs and deteriorate the reliability. The semiconductor structure 10 may allow the stacking of both similar and/or dissimilar wafers, greatly improving inter-chip interconnect density while reducing a product's form factor. The semiconductor structure 10 can provide high computing performance and high memory bandwidth to meet high performance computing (HPC) needs on clouds, data center, and high-end servers.

The semiconductor structure 100A includes the semiconductor device 20, the conductive via 106, insulation layers 110 and 114, conductive contacts 132, 134, 136 and conductive connections 103, 118, 120, 122, 123, 124, 126, 128, 130. The substrate 200 of the semiconductor device 20 is disposed between the insulation layers 110 and 114. The MIM capacitors C1, C2 are embedded within the substrate 200. The MIM capacitors C1, C2 and the conductive via 106 are arranged or formed along the X direction which is vertical to the Y direction.

The semiconductor structure 100B includes a substrate 109, an insulation layer 111, a conductive contact 140, and two processing units 182 and 184. The insulation layer 111 is disposed on the substrate 109. The processing units 182 and 184 are surrounded by the insulation layer 111. The processing units 182 and 184 are encapsulated by the insulation layer 111.

The processing units 182 and 184 can be electronic components. The processing units 182 and 184 are configured to perform high-speed computing. In some embodiments, the processing units 182 and 184 can be anyone or combination of the following: logic, memory, integrated passive device (IPD), Micro Electro Mechanical Systems (MEMS), digital signal processor (DSP), microcontroller (MCU), central-processing unit (CPU) or a plurality of parallel processors relating the parallel processing environment to implement the operating system (OS), firmware, driver and/or other applications of an electronic apparatus.

The processing unit 182 includes a conductive contact 138 and conductive connections 144, 146 and 150. The conductive contact 138 and the conductive connections 144, 146 and 150 may include, for example but is not limited to, aluminum (Al), copper (Cu), titanium (Ti), tungsten (W) or other suitable material(s) (e.g. metal, alloy or non-metal conductive material(s)).

Referring to FIG. 23, the conductive contact 138 is formed at the surface of the semiconductor structure 100B facing the semiconductor structure 100A. The conductive contact 138 is embedded within the insulation layer 111. An upper surface of the conductive contact 138 is exposed from the insulation layer 111 to be in contact with the semiconductor structure 100A. The processing unit 184 includes a conductive contact 142 and conductive connections 148 and 152. The conductive contact 142 is formed at the surface of the semiconductor structure 100B facing the semiconductor structure 100A. The conductive contact 142 is embedded within the insulation layer 111. An upper surface of the conductive contact 142 is exposed from the insulation layer 111 to be in contact with the semiconductor structure 100A.

The conductive contacts 132, 134 and 136, and the conductive connections 118, 120, 122, 123, 124, 126, 128 and 130 are formed within the insulation layer 110. The conductive connection 118 is in contact with the conductive via 106. The conductive connection 120 is electrically-coupled to the MIM capacitors C1, C2.

The conductive contacts 132, 134 and 136 are formed adjacent a surface of the semiconductor structure 100A facing the semiconductor structure 100B. The conductive contacts 132, 134 and 136 are embedded within the insulation layer 110. The surface of the conductive contacts 132, 134 and 136 are exposed from the insulation layer 110 to be in contact with the conductive contacts 138, 140 and 142 of the semiconductor structure 100B, respectively.

In some embodiments, the conductive contact 132 of the semiconductor structure 100A is in direct contact with the conductive contact 138 of the semiconductor structure 100B. The conductive contact 134 of the semiconductor structure 100A is in direct contact with the conductive contact 140 of the semiconductor structure 100B. The conductive contact 136 of the semiconductor structure 100A is in direct contact with the conductive contact 142 of the semiconductor structure 100B.

The semiconductor structure 100A and the semiconductor structure 100B can be directly connected through the conductive contacts 132 and 138. The semiconductor structure 100A and the semiconductor structure 100B can be directly connected through the conductive contacts 132, 134, 138 and 140. The semiconductor structure 100A and the semiconductor structure 100B can be directly connected through the conductive contacts 132, 134, 136, 138, 140 and 142.

Moreover, the conductive connections 103 and 105 are surrounded by the insulation layer 114. The conductive connection 105 is embedded within the encapsulation layer 112 and the insulation layer 114. The conductive connection 103 is in contact with the conductive via 106. The conductive connection 105 is in contact with the conductive connection 103. A portion of the conductive connection 105 is exposed from the insulation layer 114 and surrounded by the encapsulation layer 112. A portion of the conductive connection 105 is exposed from the encapsulation layer 112 and surrounded by the insulation layer 114.

The encapsulation layer 112 overlays the semiconductor structure 100A. The encapsulation layer 112 covers the semiconductor structure 100A. The encapsulation layer 112 includes an epoxy resin including fillers therein, a molding compound (e.g., an epoxy molding compound or other molding compound), a polyimide, a phenolic compound or material, a material including a silicone dispersed therein, or a combination thereof. A connector 117, which can be a solder ball, is surrounded by the encapsulation layer 112. In some embodiments, a portion of the connector 117 is embedded within the encapsulation layer 112, and another portion of the connector 117 is exposed from the encapsulation layer 11.

In some embodiments, at least some of the conductive via 106, the conductive contacts 132, 134 and 136, and the conductive connections 103, 105, 118, 120, 122, 123, 124, 126, 128 and 130 of the semiconductor structure 100A collectively form a power line to receive power. The processing units 182 and 184 of the semiconductor structure 100B are configured to be driven and/or operated by the power.

The power can be received by the conductive via 106. In some embodiments, the MIM capacitors C1, C2 are electrically coupled to the conductive via 106 to regulate the power. In addition, the conductive contact 132 is in direct touch with the conductive contact 138.

Furthermore, since the MIM capacitors C1, C2 are close to the processing unit 182, the voltage loss of the power line can be lower. Therefore, the power consumption of the semiconductor structure 10 can be lower. Additionally, with the MIM capacitors C1, C2 closer to the processing units 182 and 184, the latency of the semiconductor structure 10 decreases and the response speed of the semiconductor structure 10 increases.

The substrate 200 extends along the X direction, and the conductive via 106 extends along the Y direction. In some embodiments, more than two MIM capacitors can be embedded within the substrate 200. More than two capacitors can be formed along the X direction in the semiconductor structure 100B. The capacitors can be arranged in electrically series connection with each other. The capacitors can be arranged in electrically parallel connection with each other.

The MIM capacitors C1, C2 can be electrically coupled to the connector 117, through the conductive connections 105 and 103, the conductive via 106, and the conductive connections 118. The MIM capacitors C1, C2 can be electrically coupled to a power line configured to provide power to one or more processing units within the semiconductor structure 100B.

In some embodiments, capacitors within the semiconductor structure can store or hold the electrons generated from the power for driving the processing unit of the semiconductor device. The generated electrons can be of a large amount and can sometimes deteriorate or damage the semiconductor device. In some embodiments, the capacitors can be used to provide the function of electrostatic discharge (ESD) and protect the semiconductor device by accumulating the electrons.

In some embodiments, the number of the capacitors can be determined according to the technical field of the applications for the product which includes the semiconductor device. For the application in the field of AI technology wherein a single giant processing unit is utilized, the MIM capacitors C1 and C2 may be disposed in the semiconductor structure 10. For other applications such as imaging processing or data computing wherein multiple small-scale processing units are utilized, a plurality of capacitors can be disposed in the semiconductor structure 10.

One aspect of the present disclosure provides a method of manufacturing a semiconductor structure. The method includes providing a substrate; forming a trench with a predetermined aspect ratio in the substrate to form two fins, wherein the forming of the trench induces the substrate to warp toward a first direction; forming a metal-insulator-metal (MIM) stack on sidewalls of the two fins in the trench, and leaving a space surrounded by the MIM stack in the trench; determining whether the substrate warps toward a second direction reverse to the first direction after the forming of the MIM stack; and in response to the substrate warping toward the second direction, depositing an insulating layer to cover an upper surface of the MIM stack and seal the trench to thereby leave a void in the space.

One aspect of the present disclosure provides another method of manufacturing a semiconductor structure. The method includes providing a substrate; forming two fins separated by a trench with a predetermined aspect ratio in the substrate; forming a capacitor on surfaces of the two fins, and leaving a space surrounded by the capacitor between the two fins; determining a warpage level of the substrate; and depositing an insulating layer over the capacitor and the trench to seal the space and leave a void in the trench, wherein a thickness of the insulating layer in the trench is associated with the warpage level of the substrate.

Another aspect of the present disclosure provides a semiconductor structure. The semiconductor structure includes a substrate. Two fins separated to each other are disposed in the substrate. A first conductive layer is disposed on the substrate and sidewalk of the two fins. A first dielectric layer is disposed on the first conductive layer. A second conductive layer is disposed on the dielectric layer. An insulating layer covers a top portion and side-walls of the second conductive layer. The insulating layer includes a void within the insulating layer. The void has a first width proximal to the adjacent upper corners of the two fins less than a second width proximal to a bottom of the trench.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:

providing a substrate;

forming a trench with a predetermined aspect ratio in the substrate to form two fins, wherein the forming of the trench induces the substrate to warp toward a first direction;

forming a liner layer to cover the substrate and the two fins, wherein the liner layer has different widths at different heights of the two fins, resulting in sidewalls of the liner layer within the trench being parallel to each other;

forming a metal-insulator-metal (MIM) stack on the side-walls of the liner layer that are on the two fins in the trench, and leaving a space surrounded by the MIM stack in the trench;

determining whether the substrate warps toward a second direction reverse to the first direction after the forming of the MIM stack; and depositing an insulating layer to cover an upper surface of the MIM stack and seal the trench, thereby leaving a void in the space, wherein an amount of the insulating layer is associated with a warpage level of the substrate.

2. The method of claim 1, wherein the predetermined aspect ratio ranges from about 20:1 to about 140:1.

3. The method of claim 1, wherein the void tapers from a bottom of the trench toward an entrance of the trench.

4. The method of claim 1, wherein the insulating layer is formed by plasma-enhanced CVD (PECVD), and a flow rate of gas precursors of the insulating layer is greater than 10 sccm.

5. The method of claim 1, wherein the forming of the MIM stack includes:

depositing a first conductive layer on the liner layer;

depositing a dielectric layer on the first conductive layer; and depositing a second conductive layer on the dielectric layer to thereby keep the trench open with a substantially equal width across a height of the trench.

6. The method of claim 5, wherein each of the first conductive layer, the dielectric layer and the second conductive layer is deposited using an ALD operation.

7. The method of claim 5, wherein each of the first conductive layer, the dielectric layer and the second conductive layer grows at a first deposition rate slower than a second deposition rate of the insulating layer.

8. The method of claim 7, wherein the first deposition rate keeps substantially constant during the forming of the MIM stack, and the second deposition rate decreases from the bottom of the trench toward the entrance of the trench.

9. The method of claim 7, wherein the second deposition rate of the insulating layer outside the trench is greater than the second deposition rate of the insulating layer inside the trench.

10. A method of manufacturing a semiconductor structure, comprising:

providing a substrate;

forming two fins separated by etching a trench with a predetermined aspect ratio in the substrate;

forming a liner layer to cover the substrate and the two fins, wherein the liner layer has different widths at different heights of the two fins, resulting in sidewalls of the liner layer within the trench being parallel to each other on the two fins;

forming a capacitor on the sidewalls of the liner layer that are on the two fins, and leaving a space surrounded by the capacitor between the two fins;

determining a warpage level of the substrate; and depositing an insulating layer over the capacitor and the trench to seal the space and leave a void in the trench, wherein a thickness of the insulating layer in the trench is associated with the warpage level of the substrate.

11. The method of claim 10, wherein the forming of the capacitor comprising depositing an MIM stack includes depositing a dielectric layer sandwiched between a pair of conductive layers, wherein the dielectric layer is made of a high dielectric constant (high k) material including $HfO_2$, $Ta_2O_5$, AlO, SIN, SiNO, $Al_2O_3$, $TiO_2$, $ZrO_2$, $La_2O_3$ or $Pr_2O_3$ and has a thickness less than 100 angstroms (Å), the pair of conductive layers is made of polysilicon or metals and each of the pair of conductive layers has a thickness between about 200 Å and about 300 Å, and the insulating layer is made of an antireflective material, undoped silicon glass, or oxide.

12. The method of claim 10, wherein the insulating layer is deposited to an amount over the capacitor such that the insulating layer over adjacent upper corners of the two fins is thick enough to contact each other to completely cover the space, and the insulating layer is nonuniformly coated on an inner sidewall of the trench.

13. The method of claim 12, wherein when the space is sealed, the void has a first width proximal to the adjacent upper corners of the two fins less than a second width proximal to a bottom of the trench, and a height of the void is equal to or more than 95% of a depth of the trench.

14. The method of claim 12, wherein when the space is sealed, a distance between a bottommost point of the void and a bottommost point of the trench is in a range of about 80 nanometers (nm) to about 120 nm.

15. The method of claim 12, wherein when the space is sealed, the insulating layer covering an upper portion of the capacitor in a top half of the trench accumulates to a first thickness, and the insulating layer covering a lower portion of the capacitor in a bottom half of the trench accumulates to a second thickness, where in a thickness ratio between the first thickness and the second thickness is about 1.5 to about 5.5.

16. A semiconductor structure, comprising:

a substrate;

two fins separated to each other by a trench in the substrate;

a liner layer continuously on the substrate and the two fins, wherein the liner layer has different widths at different heights of the two fins, resulting in sidewalls of the liner layer within the trench being parallel to each other;

a first conductive layer on the liner layer over the substrate and sidewalls of the two fins;

a dielectric layer on the first conductive layer;

a second conductive layer on the dielectric layer; and an insulating layer covering a top portion and sidewalls of the second conductive layer in the trench, wherein the insulating layer includes a void within the insulating layer, wherein the void has a first width proximal to adjacent upper corners of the two fins less than a second width proximal to a bottom of the fins.

17. The semiconductor structure of claim 16, wherein the height of each one of the two fins is between about 3 micrometers (μm) and about 15 μm.

18. The semiconductor structure of claim 17, wherein the void tapers from the bottom of the fins toward the adjacent upper corners of the two fins, and the height of the void is equal to or more than 95% of the height of each one of the two fins.

19. The semiconductor structure of claim 17, wherein the insulating layer has a first thickness that is proximal to the adjacent upper corners of the two fins and greater than a second thickness that is proximal to the bottom of the fins, and wherein the first thickness decreases to the second thickness in a direction toward the bottom of the fins.

20. The semiconductor structure of claim 19, wherein the first thickness is between about 15 nm and about 22 nm and the second thickness is between about 4 nm and about 10 nm.

* * * * *